(12) United States Patent
Seong et al.

(10) Patent No.: US 9,952,480 B2
(45) Date of Patent: Apr. 24, 2018

(54) DISPLAY DEVICE

(71) Applicant: SAMSUNG DISPLAY CO., LTD., Yongin-si, Gyeonggi-do (KR)

(72) Inventors: Jaemin Seong, Suwon-si (KR); Kyunghee Kim, Seongnam-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 15/400,170

(22) Filed: Jan. 6, 2017

(65) Prior Publication Data

US 2017/0285428 A1 Oct. 5, 2017

(30) Foreign Application Priority Data

Apr. 4, 2016 (KR) ........................ 10-2016-0041128

(51) Int. Cl.
| | |
|---|---|
| *H01L 27/12* | (2006.01) |
| *G02F 1/1362* | (2006.01) |
| *G09G 3/36* | (2006.01) |
| *G02F 1/1368* | (2006.01) |
| *G02F 1/1343* | (2006.01) |

(52) U.S. Cl.
CPC ...... *G02F 1/136286* (2013.01); *G02F 1/1368* (2013.01); *G02F 1/134309* (2013.01); *G02F 1/136209* (2013.01); *G02F 1/136227* (2013.01); *G09G 3/3648* (2013.01); *H01L 27/124* (2013.01); *G02F 2201/123* (2013.01); *G02F 2201/40* (2013.01); *G02F 2202/22* (2013.01); *G09G 2300/0465* (2013.01)

(58) Field of Classification Search
CPC ................................................... H01L 27/124
See application file for complete search history.

(56) References Cited

U.S. PATENT DOCUMENTS

| | | | |
|---|---|---|---|
| 6,262,784 B1* | 7/2001 | Kim ..................... | G02F 1/1309 349/38 |
| 2002/0089615 A1* | 7/2002 | Sakamoto ......... | G02F 1/136227 349/43 |
| 2007/0035677 A1 | 2/2007 | Yamazaki et al. | |
| 2012/0007084 A1* | 1/2012 | Park .................... | H01L 27/1225 257/59 |
| 2015/0001543 A1* | 1/2015 | Moon ................. | H01L 27/1244 257/72 |
| 2016/0293670 A1* | 10/2016 | Chen .................... | H01L 27/322 |

FOREIGN PATENT DOCUMENTS

| | | |
|---|---|---|
| KR | 1020070037013 A | 4/2007 |
| KR | 1020080001106 A | 1/2008 |
| KR | 1020100052645 A | 5/2010 |

* cited by examiner

*Primary Examiner* — Thao P Le
(74) *Attorney, Agent, or Firm* — Cantor Colburn LLP

(57) ABSTRACT

A display device includes a first gate line and a data line intersecting each other, a pixel electrode, a switching element comprising a gate electrode connected to the first gate line, a source electrode connected to the data line, and a drain electrode connected to the pixel electrode, and a connecting portion which connects the drain electrode with the pixel electrode, and a distance between the data line and the connecting portion is less than a distance between the data line and the gate electrode in a first direction perpendicular to the data line.

23 Claims, 13 Drawing Sheets

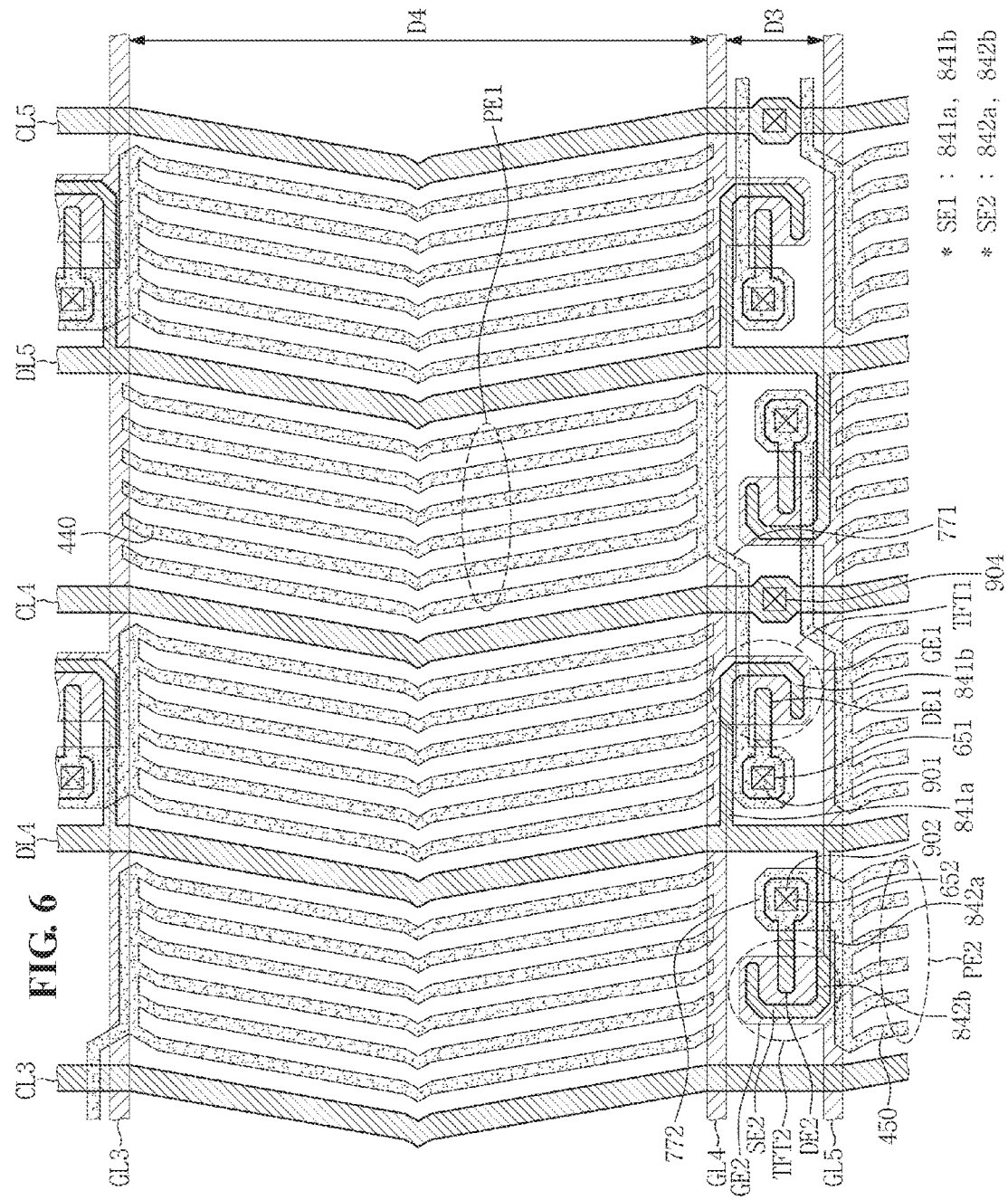

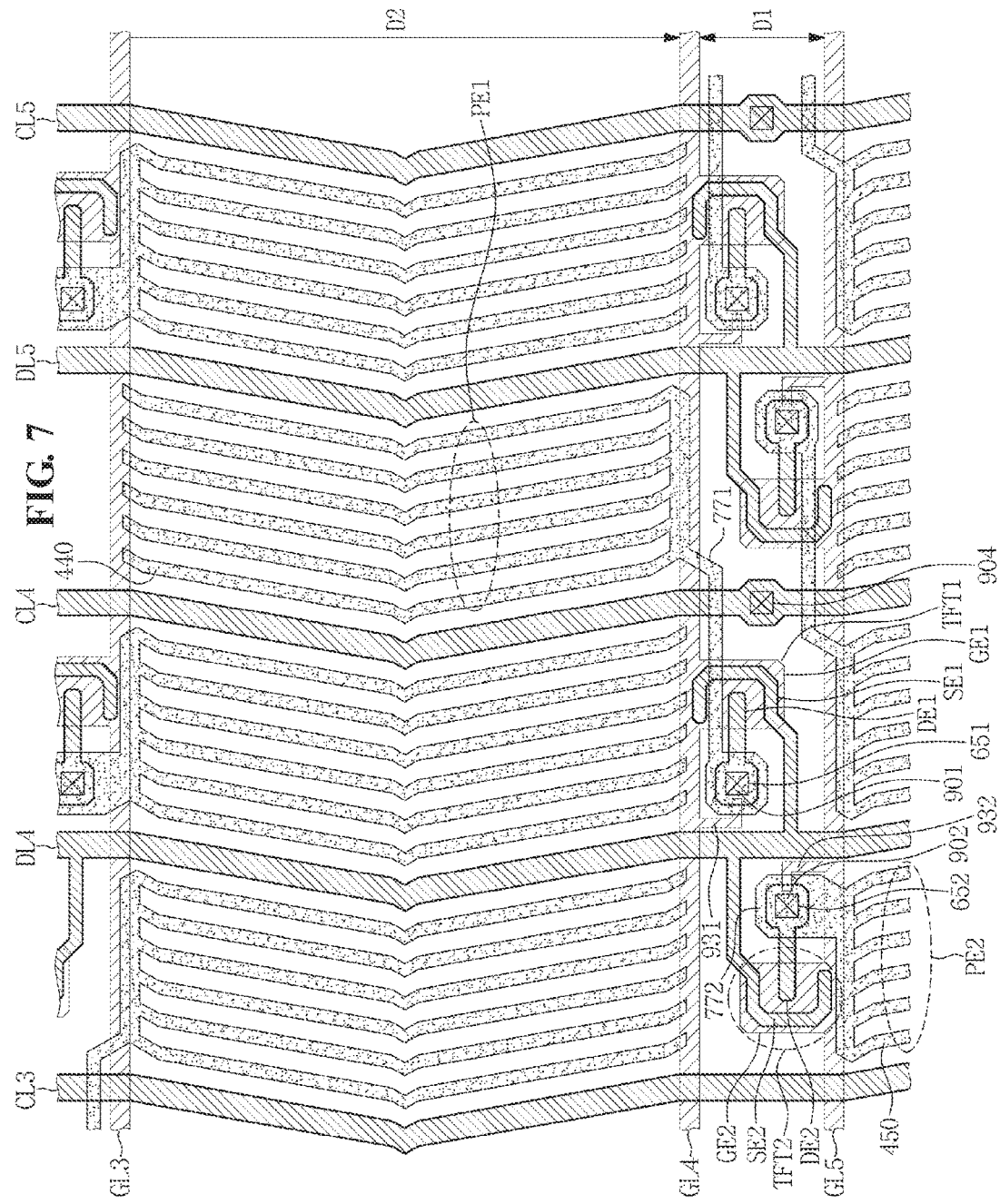

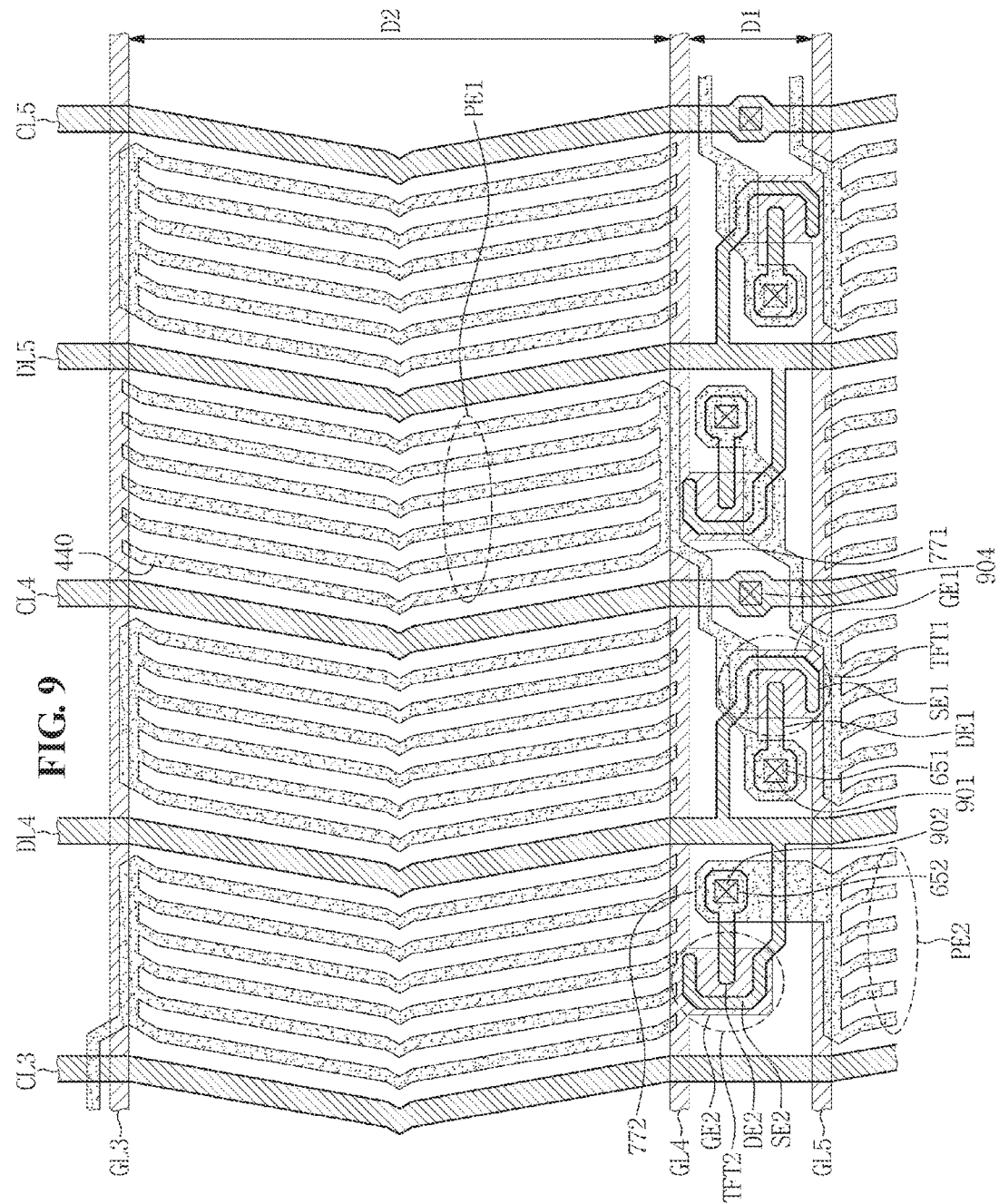

DISPLAY DEVICE

This application claims priority to Korean Patent Application No. 10-2016-0041128, filed on Apr. 4, 2016, and all the benefits accruing therefrom under 35 U.S.C. § 119, the content of which in its entirety is herein incorporated by reference.

BACKGROUND

1. Field

Exemplary embodiments of the invention relate to a display device, and more particularly, to a display device improved in terms of an aperture ratio.

2. Description of the Related Art

A liquid crystal display ("LCD") device is one of the most widely used types of flat panel display ("FPD") device. The LCD device generally includes two substrates including two electrodes respectively disposed thereon and a liquid crystal layer interposed therebetween. Upon respectively applying voltages to the two electrodes, liquid crystal molecules of the liquid crystal layer are rearranged such that an amount of transmitted light is controlled in the LCD device.

SUMMARY

Exemplary embodiments of the invention are directed to a display device improved in terms of an aperture ratio.

According to an exemplary embodiment of the invention, a display device includes a first gate line and a data line intersecting each other, a pixel electrode, a switching element including a gate electrode connected to the first gate line, a source electrode connected to the data line, and a drain electrode connected to the pixel electrode, and a connecting portion which connects the drain electrode with the pixel electrode. A distance between the data line and the connecting portion is less than a distance between the data line and the gate electrode in a first direction perpendicular to the data line.

In an exemplary embodiment, the connecting portion may be disposed between the data line and the gate electrode.

In an exemplary embodiment, the connecting portion may be disposed in an area surrounded by the data line, the gate electrode, the first gate line, and the source electrode.

In an exemplary embodiment, the drain electrode and the pixel electrode may be connected to each other through a contact hole positioned in an area corresponding to the connecting portion.

In an exemplary embodiment, the display device may further include a compensation pattern which extends from the first gate line and overlaps the drain electrode.

In an exemplary embodiment, the source electrode may include an electrode portion overlapping the gate electrode and an extension portion connecting the electrode portion and the data line.

In an exemplary embodiment, the extension portion may overlap the first gate line.

In an exemplary embodiment, the display device may further include a second gate line which intersects the data line and is closest to the first gate line among gate lines in the display device.

In an exemplary embodiment, a distance between the first gate line and the second gate line may be in a range of about 30 micrometers (μm) to about 41 μm.

In an exemplary embodiment, the display device may further include a light blocking layer which overlaps the first gate line and the second gate line and disposed between the first gate line and the second gate line.

In an exemplary embodiment, the light blocking layer may have a width from about 35 μm to about 38 μm or from about 40 μm to about 47 μm.

The gate electrode may protrude from the first gate line toward the second gate line.

In an exemplary embodiment, the display device may further include a common line intersecting the first gate line and the second gate line.

In an exemplary embodiment, the switching element may be disposed in an area surrounded by the first gate line, the second gate line, the data line, and the common line.

In an exemplary embodiment, the pixel electrode may overlap the gate electrode, the drain electrode, the common line, and the first gate line.

In an exemplary embodiment, the pixel electrode may overlap the first gate line.

In an exemplary embodiment, the pixel electrode may overlap the gate electrode, the source electrode, the common line, and the second gate line.

In an exemplary embodiment, the pixel electrode may overlap the source electrode and the second gate line.

According to an exemplary embodiment of the invention, a display device includes a first gate line and a data line intersecting each other and a first switching element which includes a first gate electrode connected to the first gate line, a first source electrode connected to the data line, and a first drain electrode including a portion disposed between the first gate electrode and the data line.

The foregoing is illustrative only and is not intended to be in any way limiting. In addition to the illustrative exemplary embodiments, and features described above, further exemplary embodiments, and features will become apparent by reference to the drawings and the following detailed description.

BRIEF DESCRIPTION OF THE DRAWINGS

The above and other features and advantages of this disclosure will be more clearly understood from the following detailed description taken in conjunction with the accompanying drawings, in which:

FIG. 6 is a detailed view illustrating an alternative exemplary embodiment of the area A of FIG. 1;

FIG. 7 is a detailed view illustrating another alternative exemplary embodiment of the area A of FIG. 1;

FIG. 9 is a detailed view illustrating an exemplary embodiment of an area B of FIG. 8.

DETAILED DESCRIPTION

Figure 1:
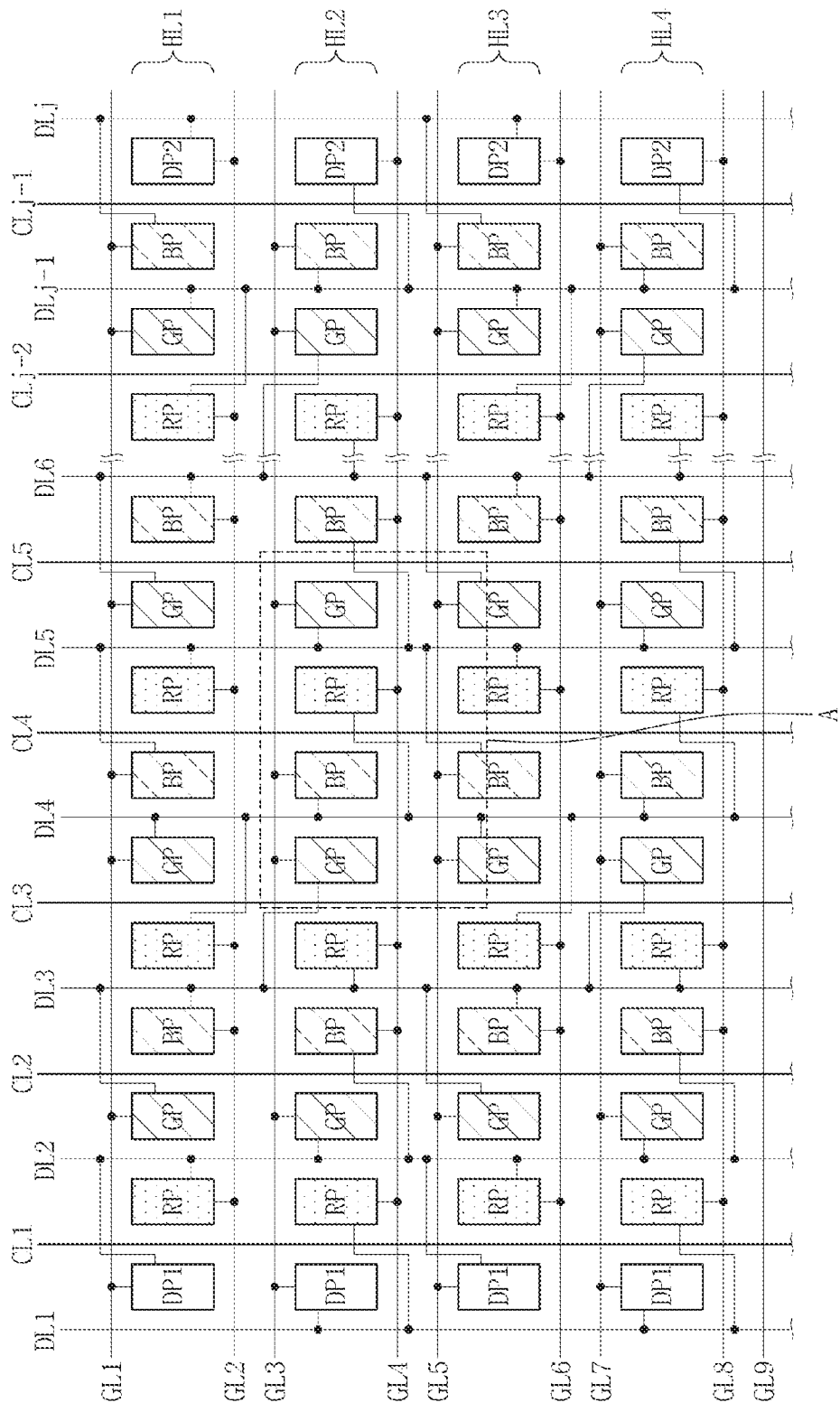
FIG. 1 is a plan view illustrating an exemplary embodiment of a display device.

Advantages and features of the invention and methods for achieving them will be made clear from exemplary embodiments described below in detail with reference to the accompanying drawings. The invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. The invention is merely defined by the scope of the claims. Therefore, well-known constituent elements, operations and techniques are not described in detail in the exemplary embodiments in order to prevent the invention from being obscurely interpreted. Like reference numerals refer to like elements throughout the specification.

In the drawings, certain elements or shapes may be illustrated in an enlarged manner or in a simplified manner to better illustrate the invention, and other elements present in an actual product may also be omitted. Thus, the drawings are intended to facilitate the understanding of the invention.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have a same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a liquid display device ("LCD") and a method of manufacturing the LCD device will be described in detail with reference to FIGS. 1 to 9.

FIG. 1 is a plan view illustrating an exemplary embodiment of a display device.

As illustrated in FIG. 1, an exemplary embodiment of a display device may include a plurality of gate lines GL1, GL2, . . . , a plurality of data lines DL1 to DLj, a plurality of common lines CL1 to CLj−1, a plurality of pixels RP, GP, and BP, a plurality of first dummy pixels DP1, and a plurality of second dummy pixels DP2.

The plurality of pixels DP1, RP, GP, BP, and DP2 include a red pixel RP representing a red image, a green pixel GP representing a green image, a blue pixel BP representing a blue image, the first dummy pixel DP1, and the second dummy pixel DP2.

Although not illustrated in FIG. 1, each of the pixels DP1, RP, GP, BP, and DP2 includes a switching element and a pixel electrode connected to the switching element. Each of the switching elements is connected to a corresponding one of the gate lines and a corresponding one of the data lines, and FIG. 1 illustrates which gate line and which data line respective switching elements of the pixels is connected to. In other words, FIG. 1 illustrates electrical connection relationship between each of the switching elements of the pixels and a corresponding gate line and electrical connection relationship between each of the switching elements of the pixels and a corresponding data line. In an exemplary embodiment, for example, a switching element included in the first dummy pixel DP1 among pixels in a first horizontal line HL1 may be connected to the first gate line GL1 and the second data line DL2.

In an exemplary embodiment, a position of a pixel in FIG. 1 substantially corresponds to a position of a pixel electrode of the pixel among components included in the corresponding pixel. In an exemplary embodiment, for example, a first red pixel RP from the left, which is connected to the first data line DL1, among pixels in a second horizontal line HL2 may be disposed between the third gate line GL3 and the fourth gate line GL4. However, a switching element of the first red pixel RP is not disposed between the third gate line GL3 and the fourth gate line GL4, but disposed between the fourth gate line GL4 and the fifth gate line GL5. Hereinafter, the position of a pixel or a dummy pixel to be described with reference to FIG. 1 refers to the position of a pixel electrode of the pixel among components included in the corresponding pixel. A description, "a predetermined pixel is disposed between the first gate line GL1 and the second gate line GL2," with reference to FIG. 1, means that a pixel electrode of the predetermined pixel is disposed between the first gate line GL1 and the second gate line GL2, for example. A description, "a predetermined pixel is disposed between the first data line DL1 and the first common line CL1," with reference to FIG. 1, means that a pixel electrode of the predetermined pixel is disposed between the first data line DL1 and the first common line CL1, for another example.

Each of the first and second dummy pixels DP1 and DP2 may be a pixel that represents a blue color. The first dummy pixels DP1 are disposed at a leftmost portion of respective horizontal lines. The second dummy pixels DP2 are disposed at a rightmost portion of respective horizontal lines. The first dummy pixels DP1 and the second dummy pixels DP2 are covered by a light blocking layer 376 (refer to FIG. 3).

The first dummy pixels DP1 are disposed between the first data line DL1 which is a leftmost one of the plurality of data lines DL1 to DLj and the first common line CL1 which is a leftmost one of the plurality of common lines CL1 to CLj−1. Pixel electrodes of the second dummy pixels DP2 are disposed between the j-th data line DLj which is a rightmost one of the plurality of data lines DL1 to DLj and the (j−1)-th common line CLj−1 which is a rightmost one of the plurality of common lines CL1 to CLj−1.

The pixels DP1, RP, GP, BP, and DP2 arranged along a k-th (k being a natural number) horizontal line are disposed between a (2k−1)-th gate line and a 2k-th gate line. In an exemplary embodiment, for example, pixels arranged along a third horizontal line HL3 may be disposed between the fifth gate line GL5 and the sixth gate line GL6.

Each of the common lines CL1 to CLj−1 is disposed between two adjacent data lines. In an exemplary embodiment, for example, the first common line CL1 may be disposed between the first data line DL1 and the second data line DL2. Each of the common lines CL1 to CLj−1 transmits a common voltage. Each of the common lines CL1 to CLj−1 is connected to a common electrode 330 (refer to FIG. 3). The common voltage transmitted from each of the common lines CL1 to CLj−1 is applied to the common electrode 330.

Each of the pixels DP1, RP, GP, BP, and DP2 is disposed in an area surrounded by two gate lines, a data line, and a common line. In an exemplary embodiment, for example, a red pixel RP, connected to the second data line DL2, among the pixels DP1, RP, GP, BP, and DP2 in the first horizontal line HL1 may be disposed in an area surrounded by the first gate line GL1, the second gate line GL2, the first common line CL1, and the second data line DL2.

The red pixel RP is connected to a gate line that is closer to a pixel electrode of the red pixel RP between two gate lines close to a lower portion of the red pixel RP. In an exemplary embodiment, for example, a red pixel RP in the third horizontal line HL3 may be connected to the sixth gate line GL6 which is closer to the pixel electrode of the red pixel RP between the sixth and seventh gate lines GL6 and GL7 below the red pixel RP. However, only one gate line is disposed below a red pixel RP in a last horizontal line, and thus the red pixel RP in the last horizontal line is connected to the one gate line.

The green pixel GP is connected to a gate line that is closer to a pixel electrode of the green pixel GP between two gate lines close to an upper portion of the green pixel GP. In an exemplary embodiment, for example, a green pixel GP in the third horizontal line HL3 may be connected to the fifth gate line GL5 which is closer to the pixel electrode of the green pixel GP between the fourth and fifth gate lines GL4 and GL5 above the green pixel GP. However, in an exemplary embodiment, only one gate line, e.g., the first gate line GL1, is disposed above the green pixel GP in the first horizontal line HL1, and thus the green pixel GP in the first horizontal line HL1 is connected to the one gate line, e.g., the first gate line GL1.

The blue pixel BP is connected to a gate line that is closer to a pixel electrode of the blue pixel BP between two gate lines close to a lower portion of the blue pixel BP or to a gate line that is closer to the pixel electrode of the blue pixel BP between two gate lines close to an upper portion of the blue pixel BP. In an exemplary embodiment, for example, one of blue pixels BP in the third horizontal line HL3 may be connected to the sixth gate line GL6 which is closer to the pixel electrode of the blue pixel BP between the sixth and seventh gate lines GL6 and GL7 below the blue pixel BP. In an alternative exemplary embodiment, another of the blue pixels BP in the third horizontal line HL3 is connected to the fifth gate line GL5 which is closer to the pixel electrode of the blue pixel BP between the fourth and fifth gate lines GL4 and GL5 above the blue pixel BP.

Each of the pixels DP1, RP, GP, BP, and DP2 arranged along odd-numbered horizontal lines HL1, HL3, . . . is connected to a data line that is closest to the corresponding pixel among data lines on the right side of the corresponding pixel. In an exemplary embodiment, for example, a leftmost one of the green pixels GP in the third horizontal line HL3 may be connected to the third data line DL3 which is closest to the green pixel GP among data lines on the right side of the green pixel GP.

Each of the pixels DP1, RP, GP, BP, and DP2 arranged along even-numbered horizontal lines HL2, HL4, . . . is connected to a data line that is closest to the corresponding pixel among data lines on the left side of the corresponding pixel. In an exemplary embodiment, for example, a leftmost one of the green pixels GP in the fourth horizontal line HL4 may be connected to the second data line DL2 which is closest to the green pixel GP among data lines on the left side of the green pixel GP.

Figure 2:
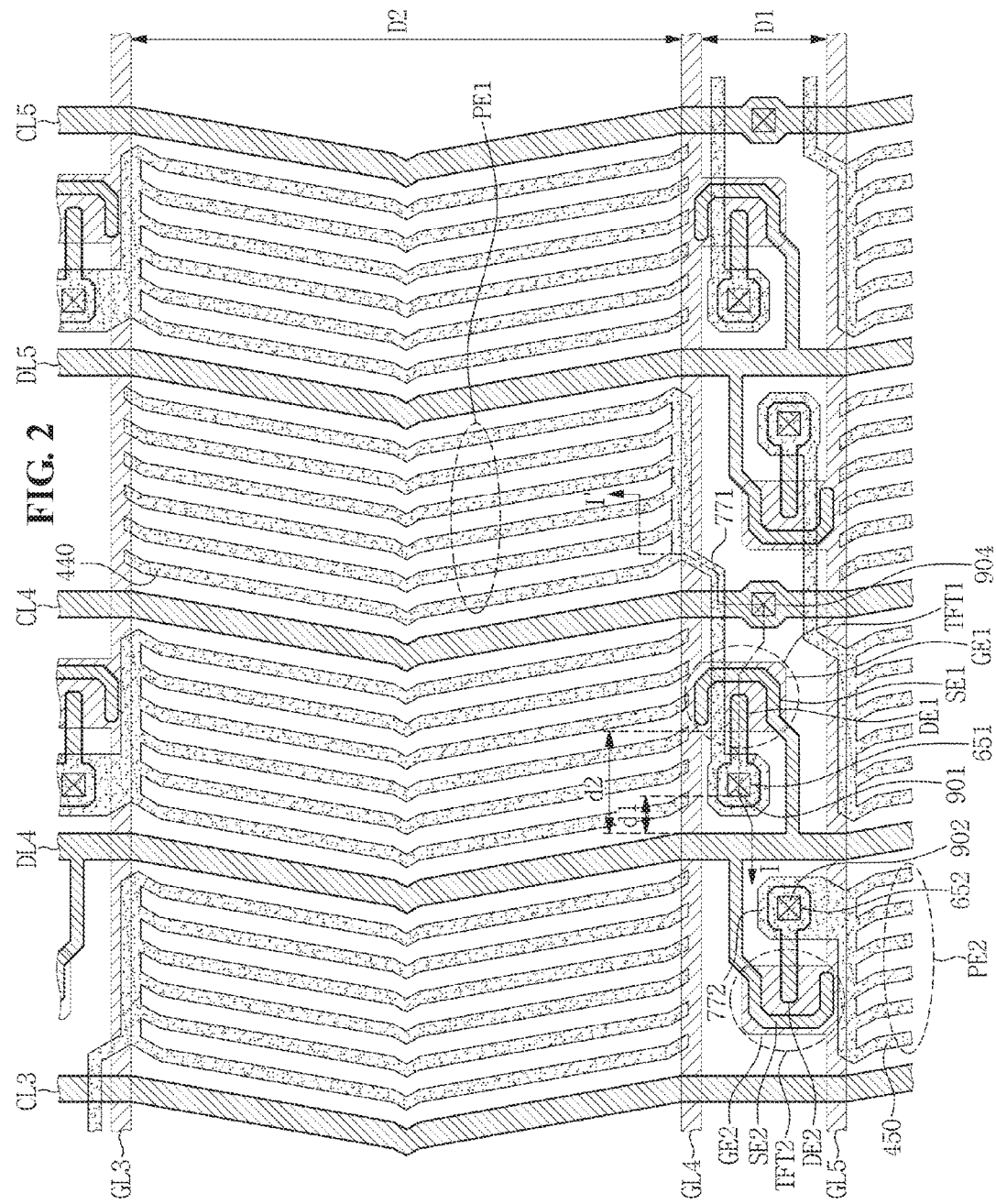
FIG. 2 is a detailed view illustrating an exemplary embodiment of an area A of FIG. 1.
Figure 3:
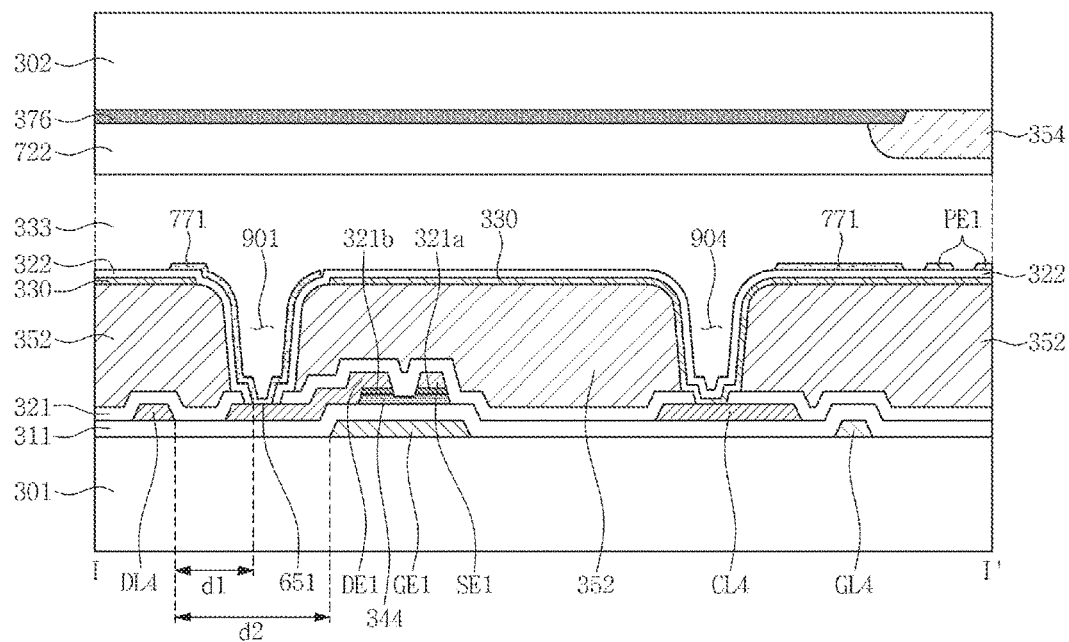
FIG. 3 is a cross-sectional view taken along line I-I' of FIG. 2.

FIG. 2 is a detailed view illustrating an exemplary embodiment of an area A of FIG. 1, and FIG. 3 is a cross-sectional view taken along line I-I' of FIG. 2.

Hereinafter, the red pixel RP in the second horizontal line HL2 among pixels in the area A of FIG. 1 is referred to as a first pixel, and a pixel disposed in the third horizontal line HL3 and connected to the fourth data line DL4 among pixels in the area A is referred to as a second pixel.

As illustrated in FIGS. 2 and 3, the display device includes a first substrate 301, a plurality of gate lines GL3, GL4, and GL5, a plurality of gate electrodes GE1 and GE2, a gate insulating layer 311, a plurality of data lines DL4 and DL5, a plurality of source electrodes SE1 and SE2, a plurality of drain electrodes DE1 and DE2, a plurality of common lines CL3, CL4, and CL5, a first passivation layer 321, an insulating interlayer 352, a plurality of pixel electrodes PE1 and PE2, a second passivation layer 322, a common electrode 330, a second substrate 302, a light blocking layer 376, a color filter 354, and a liquid crystal layer 333.

As illustrated in FIGS. 2 and 3, the first pixel includes a first switching element TFT1 and a first pixel electrode PE1.

The first switching element TFT1 is disposed in an area surrounded by the fourth gate line GL4, the fifth gate line GL5, the fourth data line DL4, and the fourth common line CL4. The first switching element TFT1 may be a thin film transistor. Hereinafter, an area surrounded by the fourth gate line GL4, the fifth gate line GL5, the first data line DL1, and the j-th data line DLj is referred to as a switching element area.

The first switching element TFT1 includes a first gate electrode GE1, a first source electrode SE1, and a first drain electrode DE1. The first gate electrode GE1 is connected to the fourth gate line GL4, the first source electrode SE1 is connected to the fourth data line DL4, and the first drain electrode DE1 is connected to the first pixel electrode PE1.

The first gate electrode GE1 and the fourth gate line GL4 may be unitary. The first gate electrode GE1 may have a shape protruding from the fourth gate line GL4 toward the fifth gate line GL5. The fifth gate line GL5 is disposed closest to the fourth gate line GL4 among the gate lines.

In an exemplary embodiment, although not illustrated, an end portion of the fourth gate line GL4 may be connected to another layer or an external driving circuit, for example. Although not illustrated, the end portion of the fourth gate line GL4 may include a larger planar area than that of another portion thereof.

The first source electrode SE1 and the fourth data line DL4 may be unitary. The first source electrode SE1 may have a shape protruding toward the first gate electrode GE1.

The first pixel electrode PE1 is disposed in an area surrounded by the third gate line GL3, the fourth gate line GL4, the fourth common line CL4, and the fifth data line DL5. Hereinafter, an area surrounded by the third gate line GL3, the fourth gate line GL4, the first data line DL1, and the j-th data line DLj is referred to as a pixel electrode area.

As illustrated in FIG. 2, the first pixel electrode PE1 may include a plurality of branch electrodes 440 that are spaced apart from one another. One end portion of each of the branch electrodes 440 is connected to a first connecting electrode 771. Each of the branch electrodes 440 may overlap adjacent gate lines that are adjacent to the corresponding one of the branch electrodes 440. In an exemplary embodiment, for example, an end portion of each of the branch electrodes 440 may overlap the third and fourth gate lines GL3 and GL4. A storage capacitor is provided in respective overlapping areas among each of the branch electrodes 440 and the third and fourth gate lines GL3 and GL4.

The first pixel electrode PE1 is connected to the first switching element TFT1. In detail, the first pixel electrode PE1 is connected to the first drain electrode DE1 of the first switching element TFT1. The first pixel electrode PE1 and the first drain electrode DE1 may be connected to each other by the first connecting electrode 771. The first connecting electrode 771 extends onto the first drain electrode DE1 from the first pixel electrode PE1. As illustrated in FIG. 2, the first connecting electrode 771 and the first pixel electrode PE1 may be unitary. The first connecting electrode 771 may be a portion of the first pixel electrode PE1.

The first connecting electrode 771 overlaps the fourth common line CL4 and the fourth gate line GL4.

A first connecting portion 651 is a connecting portion between the first drain electrode DE1 of the first switching element TFT1 and the first pixel electrode PE1. As illustrated in FIGS. 2 and 3, the first connecting portion 651 refers to a contacting interface between the first drain electrode DE1 and the first pixel electrode PE1. The first pixel electrode PE1 may physically contact the first drain electrode DE1 through a first drain contact hole 901 of the first passivation layer 321, the insulating interlayer 352, and the second passivation layer 322.

The first connecting portion 651 is disposed closer to the fourth data line DL4 than the first gate electrode GE1 is thereto. In an exemplary embodiment, for example, as illustrated in FIGS. 2 and 3, a distance d1 from the fourth data line DL4 to the first connecting portion 651 may be less than a distance d2 from the fourth data line DL4 to the first gate electrode GE1. "A distance" between two objects as used in this specification means a distance between respective ends, closest to the other object, of the objects. Herein, each of the distances d1 and d2 corresponds to a length of a line segment in a horizontal direction in FIG. 3. That is, a length of a line segment between the fourth data line DL4 and the first connecting portion 651 in the horizontal direction in FIG. 3 corresponds to the distance d1, and a length of a line segment between the fourth data line DL4 and the first gate electrode GE1 in the horizontal direction in FIG. 3 corresponds to the distance d2.

As illustrated in FIG. 2, the first connecting portion 651 and a portion of the drain electrode DE1 may be disposed between the fourth data line DL4 and the first gate electrode GE1. In an exemplary embodiment, for example, as illustrated in FIG. 2, the first connecting portion 651 may be disposed in an area surrounded by the fourth data line DL4, the first gate electrode GE1, the fourth gate line GL4, and the first source electrode SE1.

A position of the first drain contact hole 901 may correspond to a position of the first connecting portion 651.

Since the first connecting portion 651 is disposed between the fourth data line DL4 and the first gate electrode GE1, the first gate electrode GE1 may be disposed relatively far from the fourth data line DL4. Accordingly, a distance between two gate electrodes GE1 and GE2 that are adjacent to each other with the fourth data line DL4 therebetween may relatively increase. Accordingly, in an exemplary embodiment, the adjacent gate electrodes, e.g., the first and second gate electrodes GE1 and GE2, may not contact each other even when the distance D1 between the gate lines, e.g., the fourth and fifth gate lines GL4 and GL5, to which the gate electrodes GE1 and GE2 are connected respectively, decreases. Due to such a structure, in an exemplary embodiment, the distance D1 between the gate lines GL4 and GL5 which defines a length of the switching element area may decrease without contacting the first and second electrodes GE1 and GE2, and a distance D2 between the gate lines, e.g., the third and fourth gate lines GL3 and GL4, which defines a length of the pixel electrode area may increase by the decreased amount of the distance D1. As the distance D2 increases, an aperture ratio of the pixel may increase.

In an exemplary embodiment, the distance D1 between the fourth gate line GL4 and the fifth gate line GL5 may be in a range of about 30 micrometers (μm) to about 41 μm, for example. In the exemplary embodiment, for example, the distance D1 may be about 35 μm.

Hereinafter, a vertical relationship among components of the first pixel will be described in detail with reference to FIG. 3.

The fourth gate line GL4 and the first gate electrode GE1 are disposed on the first substrate 301.

In an exemplary embodiment, for example, at least one of the fourth gate line GL4 and the first gate electrode GE1 may include or consist of aluminum (Al) or alloys thereof, silver (Ag) or alloys thereof, copper (Cu) or alloys thereof, and/or molybdenum (Mo) or alloys thereof. In an alternative exemplary embodiment, for example, at least one of the fourth gate line GL4 and the first gate electrode GE1 may include or consist of one of chromium (Cr), tantalum (Ta), and titanium (Ti). In a still alternative exemplary embodiment, for example, at least one of the fourth gate line GL4 and the first gate electrode GE1 may have a multilayer structure including at least two conductive layers that have different physical properties from one another.

The gate insulating layer 311 is disposed on the fourth gate line GL4 and the first gate electrode GE1. In the exemplary embodiment, the gate insulating layer 311 is disposed over an entire surface of the first substrate 301 including the fourth gate line GL4 and the first gate electrode GE1.

In an exemplary embodiment, the gate insulating layer 311 may include or consist of silicon nitride (SiNx) or silicon oxide (SiOx), for example. The gate insulating layer 311 may have a multilayer structure including at least two insulating layers having different physical properties.

The fourth data line DL4, the fourth common line CL4, and a semiconductor layer 344 are disposed on the gate insulating layer 311. Although not illustrated, in an exemplary embodiment, for example, an end portion of the fourth data line DL4 may be connected to another layer or an external driving circuit. The end portion of the fourth data line DL4 may include a larger planar area than a planar area of another portion of the fourth data line DL4.

In order to secure a significantly high transmittance e.g., a maximum transmittance, of the display device, as illustrated in FIG. 2, in an exemplary embodiment, a central portion of the fourth data line DL4 may be bent into a V-like shape, for example. In an exemplary embodiment, central portions of the first pixel electrode PE1 and the fourth common line CL4 may be bent into a V-like shape, for example.

In an exemplary embodiment, the fourth data line DL4 may include or consist of refractory metal, such as molybdenum, chromium, tantalum, and titanium, or an alloy thereof. The fourth data line DL4 may have a multilayer structure including a refractory metal layer and a low-resistance conductive layer. In an exemplary embodiment, for example, the multilayer structure may include a double-layer structure including a lower layer of chromium or molybdenum or any alloys thereof and a upper layer of aluminum or any alloys thereof, or a triple-layer structure including a lower layer of molybdenum or any alloys thereof, an intermediate layer of aluminum or any alloys thereof, and a upper layer of molybdenum or any alloys thereof. In an alternative exemplary embodiment, for example, the fourth data line DL4 may include or consist of any suitable metals or conductors rather than the aforementioned materials.

The fourth common line CL4 may include the same material as that included in the fourth data line DL4.

The semiconductor layer 344 overlaps at least a portion of the first gate electrode GE1.

In an exemplary embodiment, for example, the semiconductor layer 344 may include amorphous silicon, polycrystalline silicon, or the like.

A first ohmic contact layer 321a and a second ohmic contact layer 321b are disposed on the semiconductor layer 344. The first ohmic contact layer 321a and the second ohmic contact layer 321b face one another with respect to a channel area of the first switching element TFT1 therebetween.

In an exemplary embodiment, at least one of the first ohmic contact layer 321a and the second ohmic contact layer 321b may include silicide or n+ hydrogenated amorphous silicon doped with n-type impurity ions, e.g., phosphorus (P) or phosphine (PH$_3$), at high concentration, for example.

The first source electrode SE1 is disposed on the first ohmic contact layer 321a. In the exemplary embodiment, although not illustrated, the first source electrode SE1 may be further disposed on the gate insulating layer 311. At least a portion of the first source electrode SE1 overlaps the semiconductor layer 344 and the first gate electrode GE1. The first source electrode SE1 may include substantially the same material and may have substantially the same structure e.g., a multilayer structure, as those of the fourth data line DL4. The first source electrode SE1 and the fourth data line DL4 may be simultaneously provided in the same manufacturing process.

The first drain electrode DE1 is disposed on the second ohmic contact layer 321b and the gate insulating layer 311. At least a portion of the first drain electrode DE1 overlaps the semiconductor layer 344 and the first gate electrode GE1. The first drain electrode DE1 is connected to the first pixel electrode PE1. The first drain electrode DE1 may include substantially the same material and may have substantially the same structure e.g., a multilayer structure, as those of the fourth data line DL4. The first drain electrode DE1 and the fourth data line DL4 may be simultaneously provided in the same manufacturing process.

The first passivation layer 321 is disposed on the fourth data line DL4, the first source electrode SE1, and the first drain electrode DE1. In the exemplary embodiment, the first passivation layer 321 may be disposed over the entire surface of the first substrate 301 including the fourth data line DL4, the first source electrode SE1, and the first drain electrode DE1, except for the first drain contact hole 901 and a common contact hole 904. The first drain contact hole 901 is defined above the first connecting portion 651, and the common contact hole 904 is defined above the fourth common line CL4.

In an exemplary embodiment, the first passivation layer 321 may include an inorganic insulating material such as silicon nitride (SiN$_x$) or silicon oxide (SiO$_x$), and in the exemplary embodiment, an inorganic insulating material having photosensitivity and having a dielectric constant of about 4.0 may be used, for example. In an exemplary embodiment, the first passivation layer 321 may have a double-layer structure including a lower inorganic layer and an upper organic layer. In an exemplary embodiment, the first passivation layer 321 may have a thickness, in a vertical direction in FIG. 3, greater than or equal to about 5000 angstroms (Å), e.g., in a range of about 6000 Å to about 8000 Å, for example.

The insulating interlayer 352 is disposed on the first passivation layer 321. The insulating interlayer 352 defines a first drain contact hole 901 and a common contact hole 904. The first drain contact hole 901 is defined above the first connecting portion 651, and the common contact hole 904 is defined above the fourth common line CL4.

The insulating interlayer 352 may include an organic layer having a low dielectric constant. In an exemplary embodiment, for example, the insulating interlayer 352 may include a photosensitive organic layer having a lower dielectric constant than that of the first passivation layer 321.

The common electrode 330 is disposed on the insulating interlayer 352. The common electrode 330 is connected to the fourth common line CL4 through the common contact hole 904.

In an exemplary embodiment, the common electrode 330 may include a transparent metal layer including indium zinc oxide ("IZO") or indium tin oxide ("ITO"), for example.

The second passivation layer 322 is disposed on the common electrode 330, the insulating interlayer 352, the first passivation layer 321, and the first drain electrode DE1.

The second passivation layer 322 may include the same material as that included in the first passivation layer 321.

The first pixel electrode PE1 and the first connecting electrode 771 are disposed on the second passivation layer 322. The first pixel electrode PE1 is connected to the first drain electrode DE1. In detail, the first pixel electrode PE1 is connected to the first drain electrode DE1 through the first connecting electrode 771 on the first drain contact hole 901.

In an exemplary embodiment, the first pixel electrode PE1 may include a transparent metal layer such as IZO or ITO, for example. In the case that the first pixel electrode PE1 includes IZO, the common electrode 330 may include ITO.

The light blocking layer 376 is disposed on the second substrate 302. The light blocking layer 376 is disposed on an area corresponding to areas of the gate lines, the data lines, and the common lines and the switching element areas (refer to FIG. 4). The light blocking layer 376 defines an aperture in an area corresponding to a pixel area. As the distance D2 of the pixel electrode area increases, the size of an aperture of the light blocking layer 376 may also increase. Although not illustrated, the light blocking layer 376 may be disposed on the first substrate 301, rather than the second substrate 302. In the exemplary embodiment, the light blocking layer 376 is disposed on the second passivation layer 322. In the exemplary embodiment, the light blocking layer 376 is also disposed on an area corresponding to areas of the gate lines, the data lines, and the common lines and the switching element areas.

The color filter 354 is disposed on the second substrate 302. In an exemplary embodiment, the color filter 354 is disposed in a portion of the aperture area corresponding to the pixel area. In an exemplary embodiment, an edge portion of the color filter 354 is disposed on the aperture in FIG. 3.

An overcoat layer 722 is disposed on the light blocking layer 376 and the color filter 354. The overcoat layer 722 may be disposed on substantially an entire surface of the second substrate 302 including the light blocking layer 376. In an exemplary embodiment, the overcoat layer 722 may effectively prevent a height difference among components of the second substrate 302, i.e., the light blocking layer 376 and the color filter 354 from being transferred to the liquid crystal layer 333. In an alternative exemplary embodiment, the overcoat layer 722 may be omitted.

The liquid crystal layer 333 is disposed between the first substrate 301 and the second substrate 302. In an exemplary embodiment, the liquid crystal layer 333 may include homeotropic liquid crystal molecules having a negative dielectric anisotropy, for example. In an alternative exemplary embodiment, the liquid crystal layer 333 may include a photopolymerizable material, and in the alternative exemplary embodiment, for example, the photopolymerizable material may be a reactive monomer or a reactive mesogen.

As illustrated in FIG. 2, the second pixel includes a second switching element TFT2 and a second pixel electrode PE2.

The second switching element TFT2 is disposed in an area surrounded by the fourth gate line GL4, the fifth gate line GL5, the third common line CL3, and the fourth data line DL4. In an exemplary embodiment, the second switching element TFT2 may be a thin film transistor, for example.

The second switching element TFT2 includes a second gate electrode GE2, a second source electrode SE2, and a second drain electrode DE2. The second gate electrode GE2 is connected to the fifth gate line GL5, the second source electrode SE2 is connected to the fourth data line DL4, and the second drain electrode DE2 is connected to the second pixel electrode PE2.

The second gate electrode GE2 and the fifth gate line GL5 may be unitary. The second gate electrode GE2 may have a shape protruding from the fifth gate line GL5 toward the fourth gate line GL4.

In an exemplary embodiment, although not illustrated, an end portion of the fifth gate line GL5 may be connected to another layer or an external driving circuit, for example. Although not illustrated, the end portion of the fifth gate line GL5 may include a larger planar area than that of another portion thereof.

The second source electrode SE2 and the fourth data line DL4 may be unitary. The second source electrode SE2 may have a shape protruding from the fourth data line DL4 toward the second gate electrode GE2.

The second pixel electrode PE2 is disposed in an area surrounded by the fifth gate line GL5, the sixth gate line GL6, the third common line CL3, and the fourth data line DL4.

As illustrated in FIG. 2, the second pixel electrode PE2 may include a plurality of branch electrodes 440 spaced apart from one another. On an end portion of each of the branch electrodes 450 is connected to a second connecting electrode 772. Each of the branch electrodes 450 may overlap adjacent gate lines that are adjacent to the corresponding one of the branch electrodes 450. In an exemplary embodiment, for example, an end portion of each of the branch electrodes 450 may overlap the fifth and sixth gate lines GL5 and GL6. A storage capacitor is provided in respective overlapping areas among each of the branch electrodes 450 and the fifth and sixth gate lines GL5 and GL6.

The second pixel electrode PE2 is connected to the second switching element TFT2. In detail, the second pixel electrode PE2 is connected to the second drain electrode DE2 of the second switching element TFT2. The second pixel electrode PE2 and the second drain electrode DE2 may be connected to each other by the second connecting electrode 772. The second connecting electrode 772 extends onto the second drain electrode DE2 from the second pixel electrode PE2. As illustrated in FIG. 2, the second connecting electrode 772 and the second pixel electrode PE2 are unitary. The second connecting electrode 772 may be a portion of the second pixel electrode PE2.

The second connecting electrode 772 overlaps the fifth gate line GL5.

A second connecting portion 652 is a connecting portion between the second drain electrode DE2 of the second switching element TFT2 and the second pixel electrode PE2. As illustrated in FIG. 2, the second connecting portion 652 refers to a contacting interface between the second drain electrode DE2 and the second pixel electrode PE2. The second pixel electrode PE2 may physically contact the second drain electrode DE2 through a second drain contact hole 902 of the first passivation layer 321, the insulating interlayer 352, and the second passivation layer 322.

The second connecting portion 652 is disposed closer to the fourth data line DL4 than the second gate electrode GE2 is thereto. In an exemplary embodiment, for example, a distance from the fourth data line DL4 to the second connecting portion 652 may be less than a distance from the fourth data line DL4 to the second gate electrode GE2. Herein, each of the distances corresponds to a length of a line segment in a horizontal direction in FIG. 3.

As illustrated in FIG. 2, the second connecting portion 652 may be disposed between the fourth data line DL4 and the second gate electrode GE2. In an exemplary embodiment, for example, as illustrated in FIG. 2, the second connecting portion 652 may be disposed in an area surrounded by the fourth data line DL4, the second gate electrode GE2, the fifth gate line GL5, and the second source electrode SE2.

A position of the second drain contact hole 902 may correspond to a position of the second connecting portion 652.

Since the first connecting portion 651 and the second connecting portion 652 are respectively disposed between the fourth data line DL4 and the gate electrode GE1 and between the fourth data line DL4 and the gate electrode GE2, and the gate electrodes GE1 and GE2 are respectively disposed adjacent to the opposite sides of the fourth data line DL4, the first gate electrode GE1 and the second gate electrode GE2 may be disposed relatively far from the fourth data line DL4. Accordingly, a distance between the two gate electrodes GE1 and GE2 that are adjacent to each other with the fourth data line DL4 therebetween may relatively increase. Accordingly, in an exemplary embodiment, the adjacent gate electrodes, e.g., the first and second gate electrodes GE1 and GE2, may not contact each other even when a distance D1 between the gate lines, e.g., the fourth and fifth gate lines GL4 and GL5, to which the gate electrodes GE1 and GE2 are connected respectively, decreases. Due to such a structure, in an exemplary embodiment, the distance D1 between the gate lines GL4 and GL5 which defines a length of the switching element area may decrease without contacting the first and second electrodes GE1 and GE2, and a distance D2 between the gate lines, e.g., the third and fourth gate lines GL3 and GL4, which defines a length of the pixel electrode area may increase by the decreased amount of the distance D1. As the distance D2 increases, an aperture ratio of the pixel may increase.

Each of the gate lines and each of the gate electrodes include the same material as that included in the first gate electrode GE1. Each of the source electrodes, each of the drain electrodes, each of the data lines, and each of the common lines include the same material as that included in the first source electrode SE1. Each of the pixel electrodes and each of the connecting electrodes include the same material as that included in the first pixel electrode PE1.

Although not illustrated, an exemplary embodiment of a display device may further include a first polarizer and a second polarizer. In a case where a surface of the first substrate 301 and a surface of the second substrate 302 that face each other are defined as upper surfaces of the corresponding substrates respectively, and surfaces opposite to the upper surfaces are defined as lower surfaces of the corresponding substrates respectively, the first polarizer is disposed on the lower surface of the first substrate 301, and the second polarizer is disposed on the lower surface of the second substrate 302.

A transmission axis of the first polarizer is perpendicular to a transmission axis of the second polarizer, and one of the transmission axes thereof is oriented parallel to the gate line GL. In an alternative exemplary embodiment, for example, the LCD device may include only one of the first polarizer and the second polarizer.

Although not illustrated, an exemplary embodiment of a display device may further include a light blocking electrode, for example. The light blocking electrode may be disposed on the second passivation layer 322 to overlap each of the data lines e.g., the fifth data line DL5. The light blocking electrode is disposed along the data line. The light blocking electrode includes the same material as that included in the first pixel electrode PE1.

The light blocking electrode receives the common voltage. The light blocking electrode prevents forming of an electric field between the data line e.g., the fifth data line DL5 and the pixel electrode e.g., the first pixel electrode PE1. Since the light blocking electrode and the common electrode 330 which receive the same common voltage are equipotential, light transmitted through a portion of the liquid crystal layer 333 between the light blocking electrode and the common electrode 330 is blocked by the second polarizer. Accordingly, in an exemplary embodiment, light leakage is prevented in an area corresponding to the data line e.g., the fifth data line DL5. In addition, as the light blocking electrode may substitute for a portion of the light blocking layer 376 on the data line e.g., the fifth data line DL5, in the case that the light blocking electrode is used in the display device, the portion of the light blocking layer 376 on the data line e.g., the fifth data line DL5, may be removed. Accordingly, in the case that the light blocking electrode is provided, an aperture ratio of the pixel may further increase.

Figure 4:
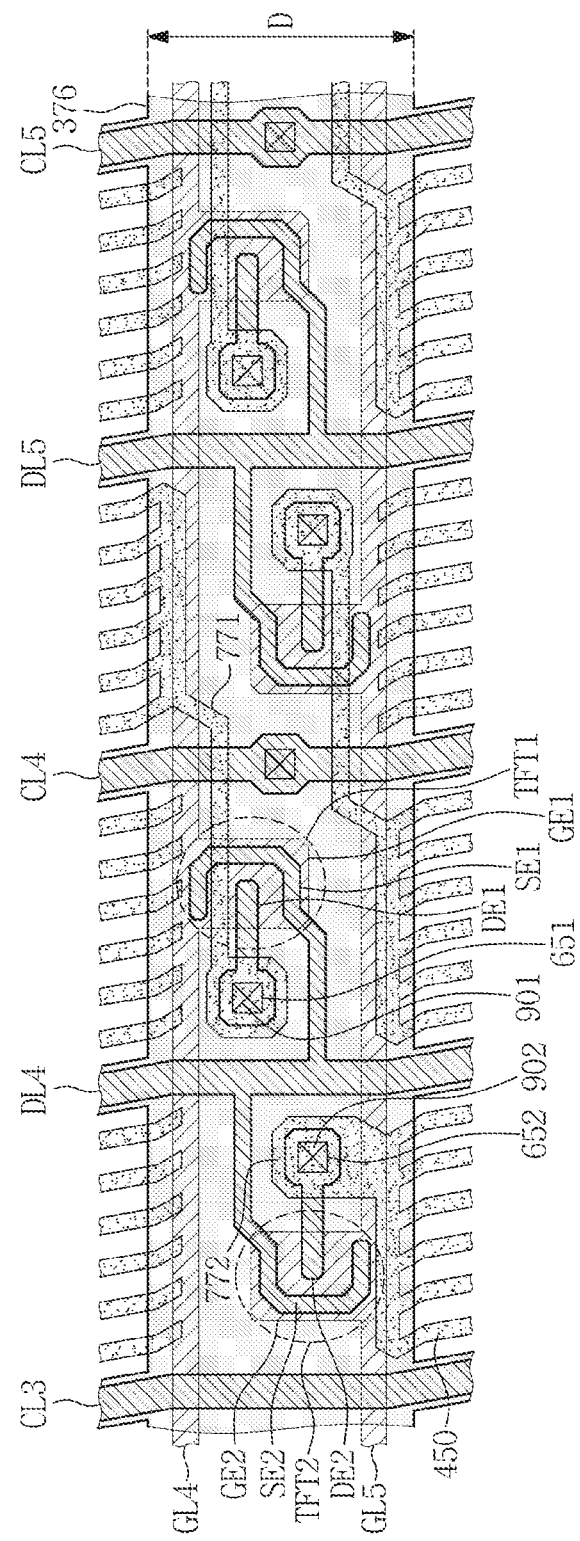
FIG. 4 is an enlarged view illustrating an exemplary embodiment of a switching element area of FIG. 2.

FIG. 4 is an enlarged view illustrating an exemplary embodiment of the switching element area of FIG. 2.

As illustrated in FIG. 4, the light blocking layer 376 is disposed on an area of the gate lines GL4 and GL5, the data lines DL4 and DL5, and the common lines CL3, CL4, and CL5 and the switching element areas. The light blocking layer 376 overlaps each of the gate lines GL4 and GL5, each of the data lines DL4 and DL5, each of the common lines CL3, CL4, and CL5, and the switching element area.

In an exemplary embodiment, a width D of the light blocking layer 376 on each of the gate lines GL4 and GL5 and the switching element area may be in a range of about 40 μm to about 47 μm, for example. In the exemplary embodiment, for example, the width D of the light blocking layer 376 may be about 41 μm.

FIGS. 5A, 5B, 5C, 5D, 5E, 5F, 5G, 5H, 5I, 5J, 5K, and 5L are cross-sectional views illustrating an exemplary embodiment of a process for manufacturing the display device of FIG. 3.

In an exemplary embodiment, although not illustrated, a gate metal layer may be disposed over an entire surface of the first substrate 301. In an exemplary embodiment, the gate insulating layer may be disposed by a physical vapor deposition ("PVD") method such as sputtering.

Figure 5A:
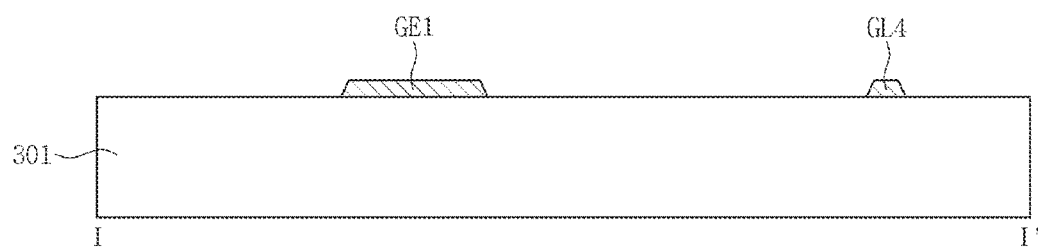
FIGS. 5A, 5B, 5C, 5D, 5E, 5F, 5G, 5H, 5I, 5J, 5K, and 5L are cross-sectional views illustrating an exemplary embodiment of a process for manufacturing the display device of FIG. 3.

Subsequently, as illustrated in FIG. 5A, the gate metal layer is patterned through a photolithography process and an etching process such that the gate line GL4 and the gate electrode GE1 are disposed on the first substrate 301.

In an exemplary embodiment, the gate metal layer may be removed by a wet-etching method using an etching solution, for example.

The gate metal layer may include or consist of the material included in the gate line.

Figure 5B:
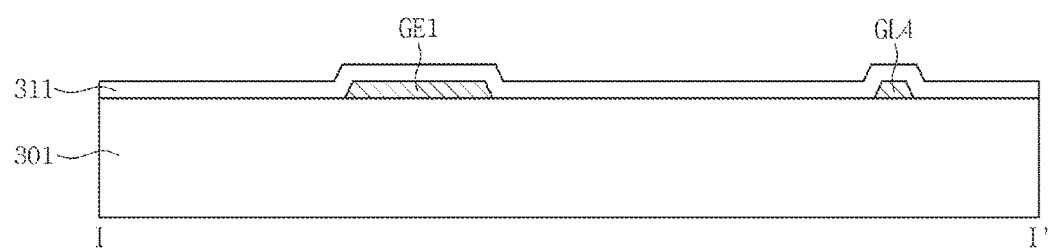

Subsequently, as illustrated in FIG. 5B, the gate insulating layer 311 is disposed over the entire surface of the first substrate 301 including the gate line GL4 and the gate electrode GE1. In an exemplary embodiment, the gate insulating layer 311 may be disposed by a chemical vapor deposition ("CVD") method, for example.

The gate insulating layer 311 may include or consist of the material included in the gate insulating layer 311.

Subsequently, although not illustrated, a semiconductor material and an impurity semiconductor material are sequentially disposed over the entire surface of the first substrate 301 including the gate insulating layer 311. In an exemplary embodiment, the semiconductor material and the impurity semiconductor material may be disposed by the CVD method, for example.

The semiconductor material may include or consist of the material included in the semiconductor layer 344.

The impurity semiconductor material may include or consist of the material included in the first and second ohmic contact layers 321a and 321b.

Figure 5C:
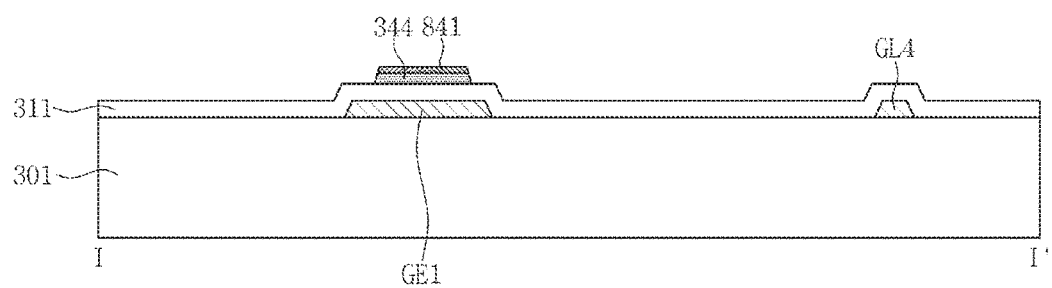

Subsequently, the semiconductor material and the impurity semiconductor material are patterned through the photolithography process and the etching process such that the semiconductor layer 344 overlapping the gate electrode GE1 is disposed on the gate insulating layer 311 and a first impurity semiconductor pattern 841 is disposed on the semiconductor layer 344 as illustrated in FIG. 5C.

In an exemplary embodiment, the semiconductor material and the impurity semiconductor material may be removed by a dry-etching method using an etching gas, for example.

Subsequently, although not illustrated, a source metal layer is disposed over the entire surface of the first substrate 301 including the semiconductor layer 344 and the impurity semiconductor pattern 841.

The source metal layer may be manufactured using the material included in the data line DL4.

Figure 5D:
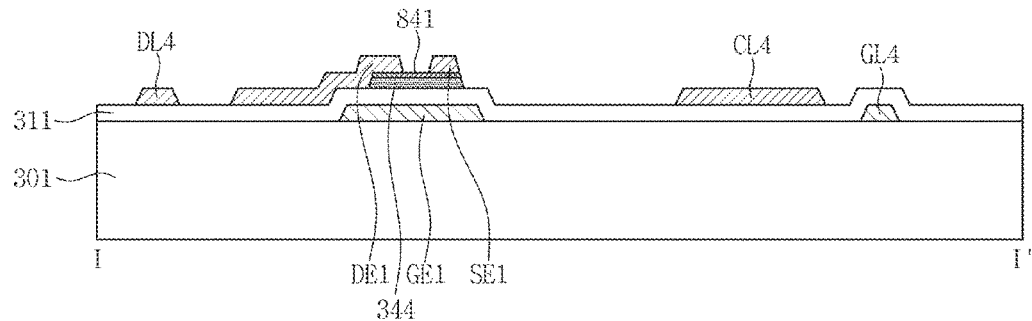

Subsequently, the source metal layer is patterned through the photolithography process and the etching process such that the data line DL4 intersecting the gate line GL4 is disposed on the gate insulating layer 311 and the source electrode SE1 and the drain electrode DE1 overlapping opposite sides of the semiconductor layer 344 are disposed on the impurity semiconductor pattern 841 as illustrated in FIG. 5D.

Figure 5E:
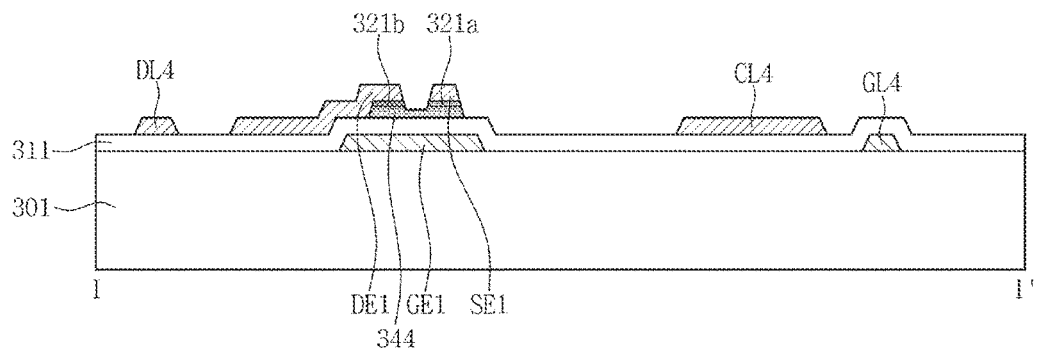

Subsequently, in the state that the source electrode SE1 and the drain electrode DE1 are used as a mask, the impurity semiconductor pattern 841 is patterned through the etching process, and as illustrated in FIG. 5E, the first ohmic contact layer 321a and the second ohmic contact layer 321b are provided. The first ohmic contact layer 321a is disposed between the source electrode SE1 and the semiconductor layer 344, and the second ohmic contact layer 321b is disposed between the drain electrode DE1 and the semiconductor layer 344.

In an exemplary embodiment, in the etching process of the impurity semiconductor pattern 841, a portion of the semiconductor layer 344 below the impurity semiconductor pattern 841 is removed. Accordingly, a thickness of a portion corresponding to a channel area of the semiconductor layer 344 is reduced.

Figure 5F:
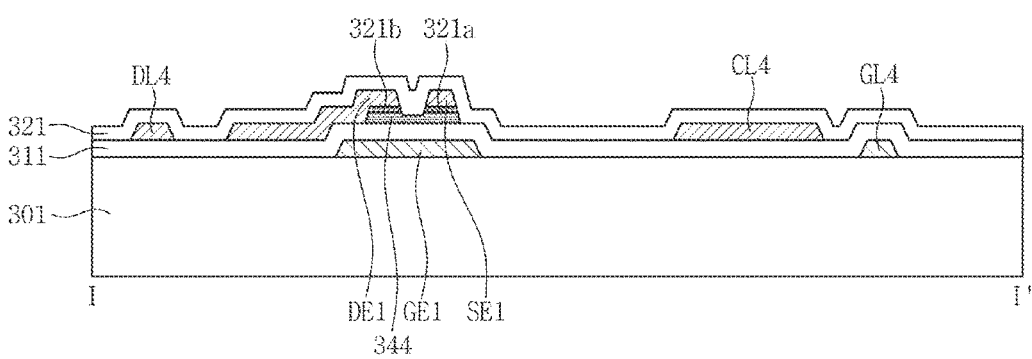

Subsequently, as illustrated in FIG. 5F, the first passivation layer 321 is disposed over the entire surface of the first substrate 301 including the data line DL4, the source electrode SE1, the drain electrode DE1, and the common line CL4.

The first passivation layer 321 may include the material included in the aforementioned first passivation layer 321.

Subsequently, although not illustrated, a photosensitive organic material is disposed over the entire surface of the first substrate 301 including the first passivation layer 321.

Figure 5G:
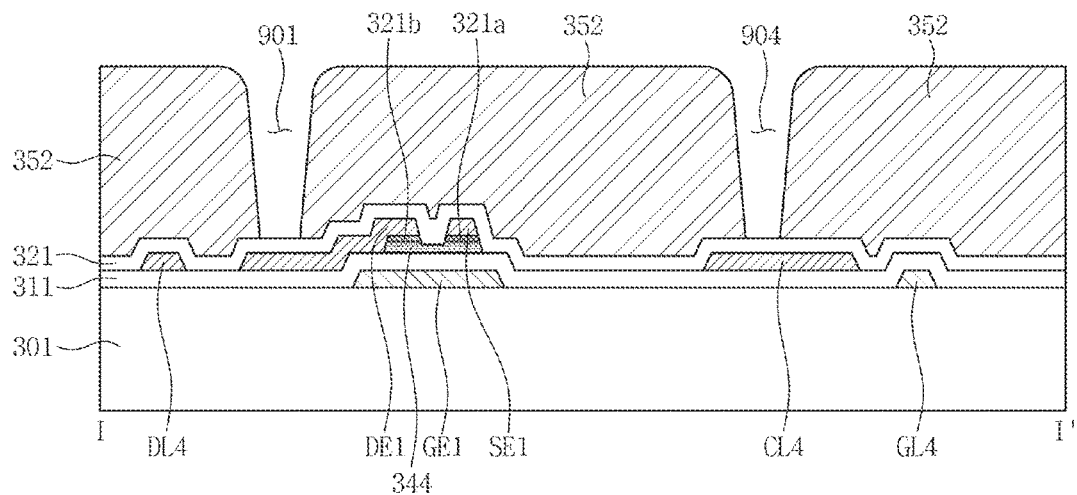

Subsequently, as the photosensitive organic material is patterned through the photolithography process, the insulating interlayer 352 having the first drain contact hole 901 and the common contact hole 904 is disposed on the first passivation layer 321 as illustrated in FIG. 5G.

Figure 5H:
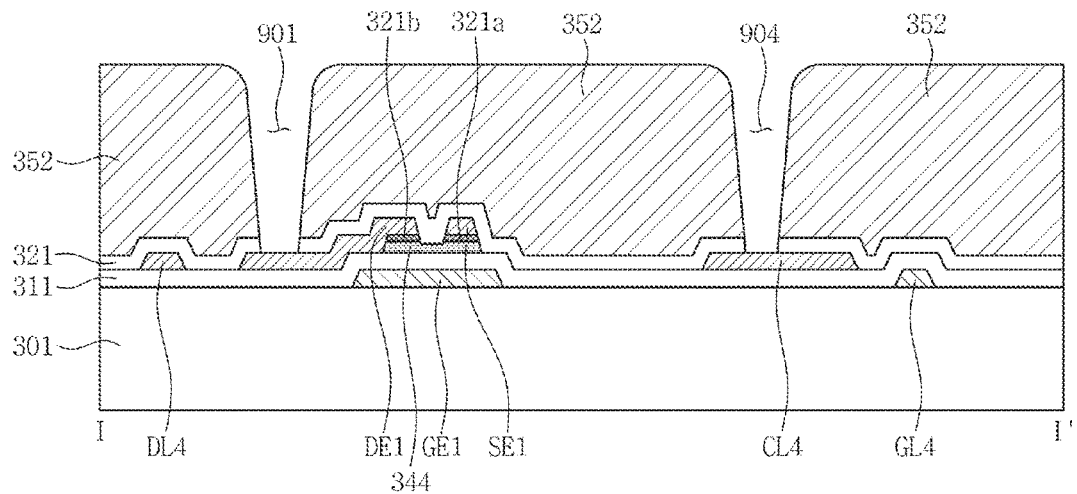

Subsequently, in the state that the insulating interlayer is used as a mask, the first passivation layer 321 is patterned through the etching process such that the first drain contact hole 901 and the common contact hole 904 are defined in the first passivation layer 321 as illustrated in FIG. 5H. A portion of the drain electrode DE1 and a portion of the common line CL4 are exposed through the first drain contact hole 901 and the common contact hole 904 of the first passivation layer 321, respectively.

Figure 5I:
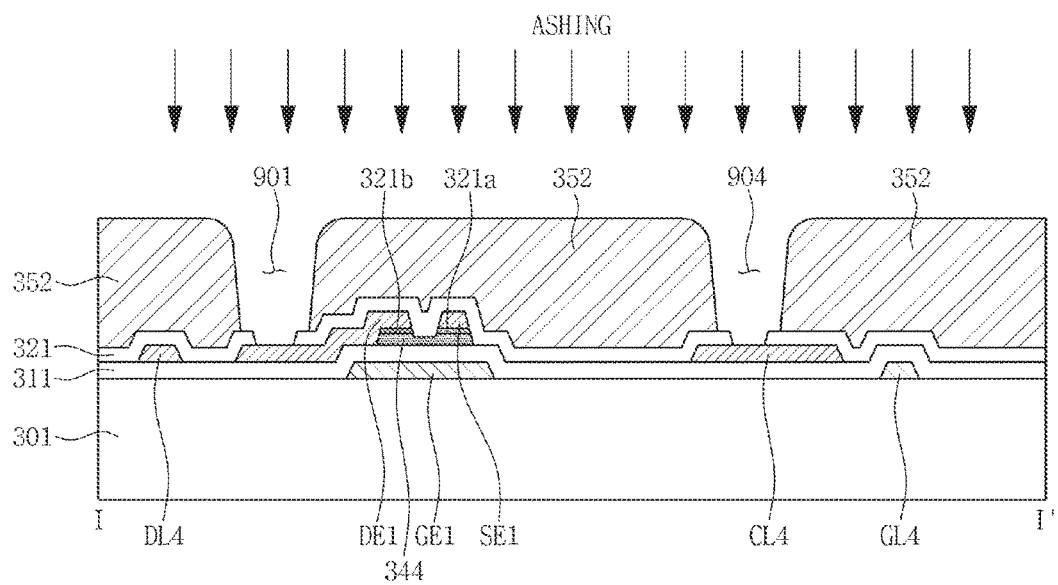

Subsequently, as illustrated in FIG. 5I, an ashing process is performed. Through the ashing process, a thickness, in a vertical direction of FIG. 5I, and a width, in a horizontal direction of FIG. 5I, of the insulating interlayer 352 are reduced. Accordingly, a width of the first drain contact hole 901 and a width of the common contact hole 904 of the insulating interlayer 352 in the horizontal direction relatively increase, and as the widths increase, a portion of the first passivation layer 321 is exposed through the first drain contact hole 901 and the common contact hole 904 of the insulating interlayer 352. As the thickness of the insulating interlayer 352 decreases, heights of inner walls of the first drain contact hole 901 and the common contact hole 904 decrease, and as the width of the insulating interlayer 352 decreases, the inner walls of the first drain contact hole 901 and the common contact hole 904 form a step-like shape, although not illustrated. The ashing process of the insulating interlayer 352 is performed so as to effectively reduce a height difference of the insulating interlayer 352 that is generated due to the first drain contact hole 901 and the common contact hole 904. Accordingly, a short circuit defect of the common electrode 330 and a short circuit defect of the pixel electrode PE1 may be prevented effectively.

Subsequently, although not illustrated, a transparent metal layer is disposed over the entire surface of the first substrate 301 including the insulating interlayer 352.

Figure 5J:
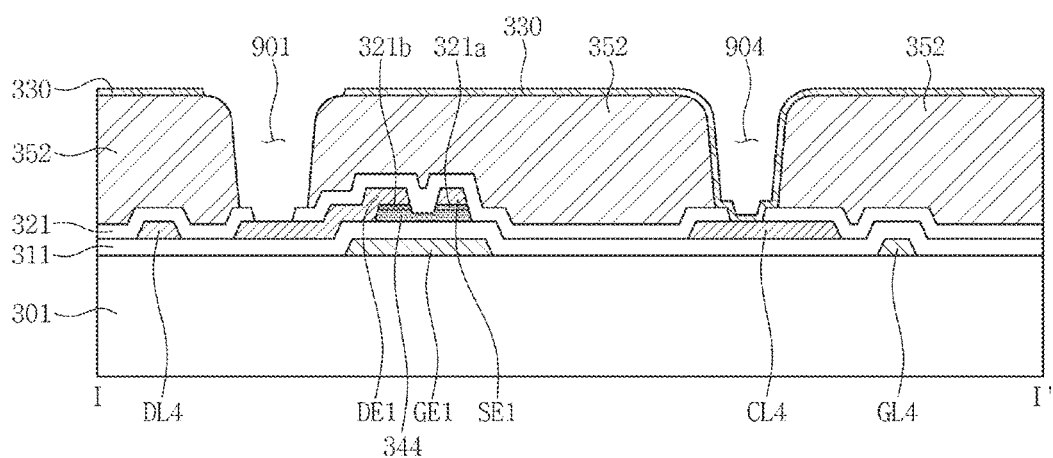

Subsequently, as the transparent metal layer is patterned through the photolithography process and the etching process, the common electrode 330 contacting the common line CL4 through the common contact hole 904 is disposed on the insulating interlayer 352 and the first passivation layer 321 as illustrated in FIG. 5J.

The transparent metal layer may include the material included in the common electrode 330.

Figure 5K:
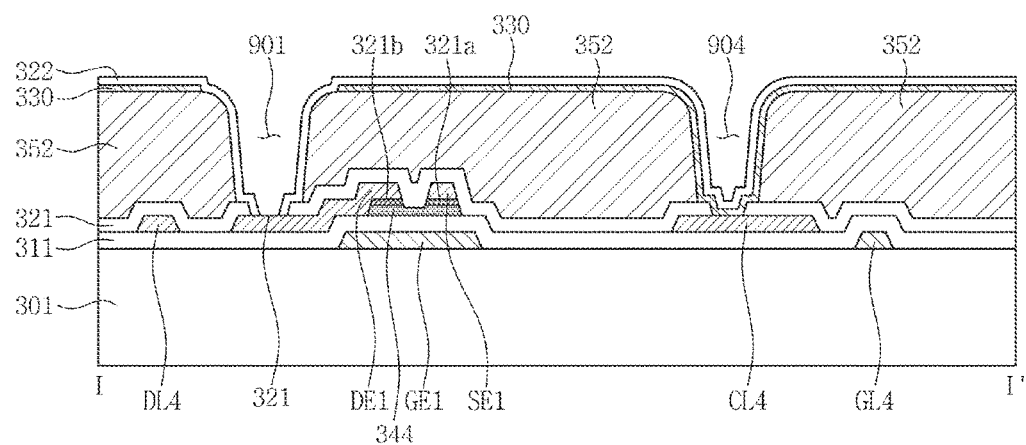

Subsequently, as illustrated in FIG. 5K, the second passivation layer 322 is disposed on the common electrode 330, the first passivation layer 321, and the drain electrode DE1. Subsequently, the second passivation layer 322 is patterned through the photolithography process and the etching process. Accordingly, the first drain contact hole 901 that exposes the drain electrode DE1 is defined in the second passivation layer 322.

The second passivation layer 322 may include the material included in the aforementioned second passivation layer 322.

Subsequently, although not illustrated, a transparent metal layer is disposed over the entire surface of the first substrate 301 including the second passivation layer 322 and the drain electrode DE1.

The transparent metal layer may include the material included in the pixel electrode PE1.

Figure 5L:
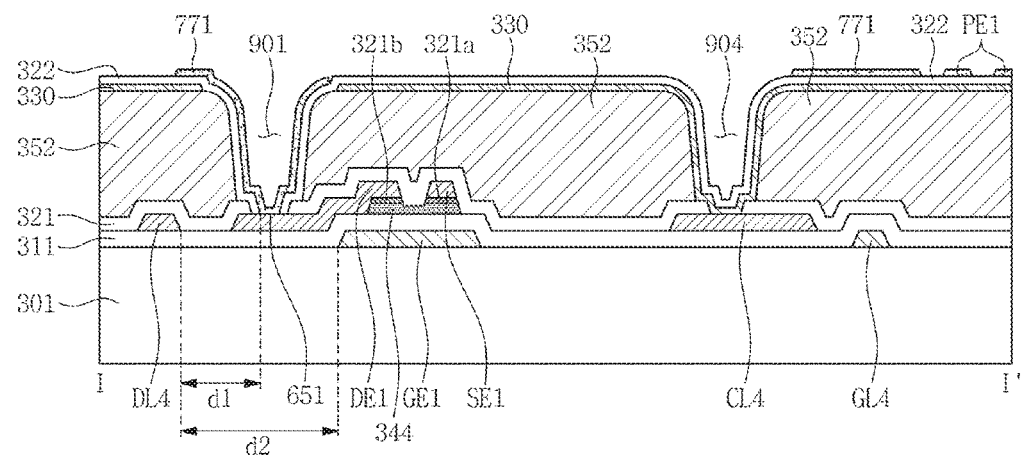

Subsequently, the transparent metal layer is patterned through the photolithography process and the etching process, and the pixel electrode PE1 and the first connecting electrode 771 that are connected to the drain electrode DE1 through the first drain contact hole 901 are disposed as illustrated in FIG. 5L.

FIG. 6 is a detailed view illustrating an alternative exemplary embodiment of the area A of FIG. 1.

The first source electrode SE1 of the first switching element TFT1 includes a first source extension portion 841a and a first source electrode portion 841b.

The first source electrode portion 841b is disposed on the first gate electrode GE1 and the fourth gate line GL4. The entire area of the first source electrode portion 841b may overlap the first gate electrode GE1 and the fourth gate line GL4.

The first source extension portion 841a extends from the fourth data line DL4 toward the first source electrode portion 841b. The first source extension portion 841a connects the fourth data line DL4 and the first source electrode portion 841b. In an exemplary embodiment, the first source extension portion 841a may overlap one of two gate lines GL4 and GL5 that are disposed adjacent to each other and included the first source extension portion 841a therebetween. In an exemplary embodiment, for example, as illustrated in FIG. 6, the first source extension portion 841a may overlap the fourth gate line GL4. In an exemplary embodiment, the fourth gate line GL4 may overlap the entire area of the first source extension portion 841a. In an alternative exemplary embodiment, although not illustrated, the first source extension portion 841a may overlap the fifth gate line GL5. In an exemplary embodiment, the fifth gate line GL5 may overlap the entire area of the first source extension portion 841a.

The second source electrode SE2 of the second switching element TFT2 includes a second source extension portion 842a and a second source electrode portion 842b.

The second source electrode portion 842b is disposed on the second gate electrode GE2 and the fifth gate line GL5. The entire area of the second source electrode portion 842b may overlap the second gate electrode GE2 and the fifth gate line GL5.

The second source extension portion 842a extends from the fourth data line DL4 toward the second source electrode portion 842b. The second source extension portion 842a connects the fourth data line DL4 and the second source electrode portion 842b. In an exemplary embodiment, the second source extension portion 842a may overlap one of two gate lines GL4 and GL5 that are disposed adjacent to each other and include the second source extension portion 842a therebetween. In an exemplary embodiment, for example, as illustrated in FIG. 6, the second source extension portion 842a may overlap the fifth gate line GL5. In an exemplary embodiment, the fifth gate line GL5 may overlap the entire area of the second source extension portion 842a. In an alternative exemplary embodiment, although not illustrated, the second source extension portion 842a may overlap the fourth gate line GL4. In an exemplary embodiment, the fourth gate line GL4 may overlap the entire area of the second source extension portion 842a.

As such, in an exemplary embodiment, in the case that the source electrode portion overlaps the gate line, a distance D3 between the gate lines, e.g., the fourth and fifth gate lines GL4 and GL5, which defines the length of the switching element area may further decrease, and a distance D4 between the gate lines, e.g., the third and fourth gate lines GL3 and GL4, which defines the pixel electrode area may further increase by the decreased length. As the distance D4 increases, an aperture ratio of the pixel may further increase. Herein, the distance D3 is less than the distance D1, and the distance D4 is more than the distance D2.

In an exemplary embodiment, the distance D3 between the fourth gate line GL4 and the fifth gate line GL5 may be in a range of about 30 μm to about 41 μm, for example. In the exemplary embodiment, for example, the distance D3 may be about 31 μm. In an exemplary embodiment, a width D of the light blocking layer 376 may be in a range of about 35 μm to about 38 μm. In the exemplary embodiment, for example, the width D may be about 37 μm.

In an exemplary embodiment, a first source extension portion of the first source electrode SE1 and a second source extension portion of the second source electrode SE2 illustrated in FIG. 2 do not overlap any of the gate lines. Except for the position of the first source extension portion 841a and the second source extension portion 841b, configurations of the display device illustrated in FIG. 2 and configurations of the display device illustrated in FIG. 6 are the same as each other, and thus descriptions pertaining to the configurations illustrated in FIG. 6 will make reference to FIGS. 2, 3, and 4 and the related descriptions thereof.

FIG. 7 is a detailed view illustrating another alternative exemplary embodiment of the area A of FIG. 1.

As illustrated in FIG. 7, an alternative exemplary embodiment of a display device may further include at least one of a first compensation pattern 931 and a second compensation pattern 932, for example.

The first compensation pattern 931 extends from the fourth gate line GL4 to overlap the first drain electrode DE1. The first compensation pattern 931 and the fourth gate line GL4 may be unitary. The first compensation pattern 931 includes the same material as the material included in the fourth gate line GL4.

The first compensation pattern 931 may significantly reduce, e.g., minimizes, variation of a size of an overlapping area, between the first gate electrode GE1 and the first drain electrode DE1, which occurs due to mask misalignment. In an exemplary embodiment, for example, in the case that the first drain electrode DE1 moves rightwards from a normal position due to the mask misalignment, an overlapping area between the first drain electrode DE1 and the first gate electrode GE1 may increase, while an overlapping area between the first drain electrode DE1 and the first compensation pattern 931 decreases. In an alternative exemplary embodiment, in the case that the first drain electrode DE1 moves leftwards from a normal position due to the mask misalignment, an overlapping area between the first drain electrode DE1 and the first gate electrode GE1 decreases, while an overlapping area between the first drain electrode DE1 and the first compensation pattern 931 increases. Therefore, although the first drain electrode DE1 moves leftwards or rightwards due to the mask misalignment, a total size of the overlapping area between the first gate electrode GE1 and the first drain electrode DE1 may be substantially constant.

The second compensation pattern 932 extends from the fifth gate line GL5 to overlap the second drain electrode DE2. The second compensation pattern 932 and the fifth gate line GL5 may be unitary. The second compensation pattern 932 may include the same material as that included in the fifth gate line GL5.

The second compensation pattern 932 may significantly reduce e.g., minimizes, variation of a size of an overlapping area, between the second gate electrode GE2 and the second drain electrode DE2, which occurs due to the mask misalignment.

A size of a parasitic capacitance of the first switching element TFT1 may be stabilized by the first compensation pattern 931, and a size of a parasitic capacitance of the second switching element TFT2 may be stabilized by the second compensation pattern 932.

Except for the first and second compensation patterns 931 and 932, configurations of the display device illustrated in FIG. 2 and configurations of the display device illustrated in FIG. 7 are the same as each other, and thus descriptions pertaining to the configurations illustrated in FIG. 7 will make reference to FIGS. 2, 3, and 4 and the related descriptions thereof.

Figure 8:
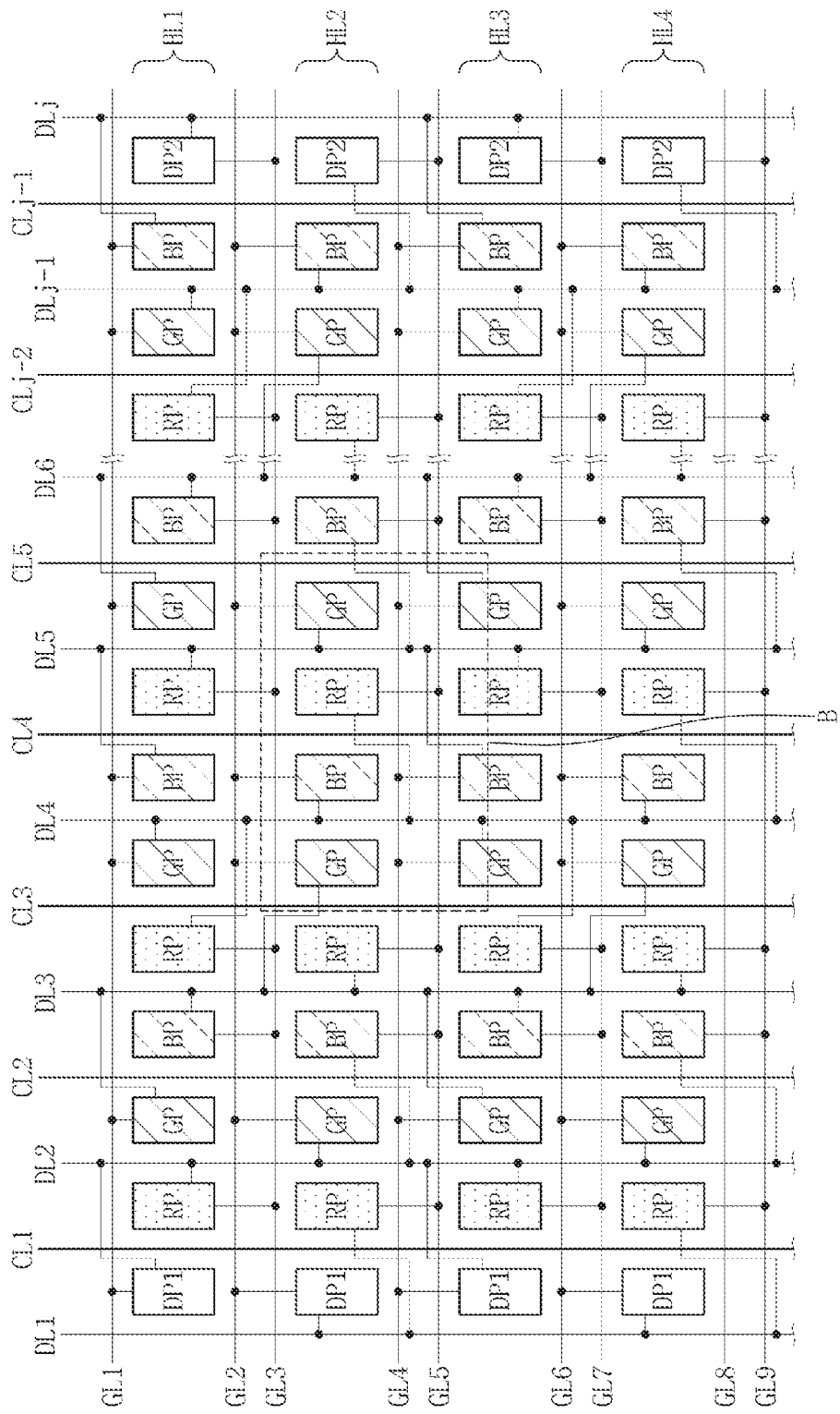
FIG. 8 is a plan view illustrating an alternative exemplary embodiment of a display device.

FIG. 8 is a plan view illustrating an alternative exemplary embodiment of a display device.

As illustrated in FIG. 8, an alternative exemplary embodiment of a display device may include a plurality of gate lines GL1, GL2, . . . , a plurality of data lines DL1 to DLj, a plurality of common line CL1 to CLj−1, a plurality of pixels RP, GP, and BP, a plurality of first dummy pixels DP1, and a plurality of second dummy pixels DP2.

The plurality of pixels DP1, RP, GP, BP, and DP2 include a red pixel RP representing a red image, a green pixel GP representing a green image, a blue pixel BP representing a blue pixel BP, the first dummy pixel DP1, and the second dummy pixel DP2.

Although not illustrated in FIG. 8, each of the pixels DP1, RP, GP, BP, and DP2 includes a switching element and a pixel electrode connected to the switching element. Each of the switching elements is connected to a corresponding one of the gate lines and a corresponding one of the data lines, and FIG. 8 illustrates which gate line and which data line each of the switching elements of the pixels is connected to. In other words, FIG. 8 illustrates an electrical connection relationship between each of the switching elements of the pixels and a corresponding gate line and an electrical connection relationship between each of the switching elements of the pixels and a corresponding data line. In an exemplary embodiment, for example, a switching element included in the first dummy pixel DP1 among pixels in a first horizontal line HL1 may be connected to the first gate line GL1 and the second data line DL2.

In an exemplary embodiment, a position of a pixel in FIG. 8 substantially corresponds to a position of a pixel electrode of a pixel among components included in the corresponding pixel. In an exemplary embodiment, for example, a first red pixel RP from the left, connected to the first data line DL1, among pixels in a second horizontal line HL2 may be disposed between the third gate line GL3 and the fourth gate line GL4. However, a switching element of the first red pixel RP is not disposed between the third gate line GL3 and the fourth gate line GL4, but disposed between the fourth gate line GL4 and the fifth gate line GL5. Hereinafter, the position of a pixel or a dummy pixel to be described with reference to FIG. 8 refers to the position of a pixel electrode of the pixel among components included in the corresponding pixel. For example, a description, "a predetermined pixel is disposed between the first gate line GL1 and the second gate line GL2," with reference to FIG. 8, means that a pixel electrode of the predetermined pixel is disposed between the first gate line GL1 and the second gate line GL2. For another example, a description, "a predetermined pixel is disposed between the first data line DL1 and the first common line CL1," with reference to FIG. 8, means that a pixel electrode of the predetermined pixel is disposed between the first data line DL1 and the first common line CL1

The red pixel RP is connected to a gate line that is disposed farther from a pixel electrode of the red pixel RP between two gate lines close to a lower portion of the red pixel RP. In an exemplary embodiment, for example, a red pixel RP in the third horizontal line HL3 may be connected to the seventh gate line GL7 which is farther from the pixel electrode of the red pixel RP between the sixth and seventh gate lines GL6 and GL7 below the red pixel RP. However, only one gate line is disposed below a red pixel RP in a last horizontal line, and thus the red pixel RP in the last horizontal line is connected to the one gate line.

The green pixel GP is connected to a gate line that is disposed farther from a pixel electrode of the green pixel GP between two gate lines close to an upper portion of the green pixel GP. In an exemplary embodiment, for example, a green pixel GP in the third horizontal line HL3 may be connected to the fourth gate line GL4 which is farther from the pixel electrode of the green pixel GP between the fourth and fifth gate lines GL4 and GL5 above the green pixel GP. However, in an exemplary embodiment, only one gate line, e.g., the first gate line GL1, is disposed above the green pixel GP in the first horizontal line HL1, and thus the green pixel GP in the first horizontal line HL1 is connected to the one gate line, e.g., the first gate line GL1.

In an exemplary embodiment, for example, the blue pixel BP is connected to a gate line that is disposed farther from a pixel electrode of the blue pixel BP between two gate lines close to a lower portion of the blue pixel BP or to a gate line that is disposed farther from the pixel electrode of the blue pixel BP between two gate lines close to an upper portion of the blue pixel BP. In an exemplary embodiment, for example, one of the blue pixels BP in the third horizontal line HL3 may be connected to the seventh gate line GL7 which is farther from the pixel electrode of the blue pixel BP between the sixth and seventh gate lines GL6 and GL7 below the blue pixel BP. In an alternative exemplary embodiment, another of the blue pixels BP in the third horizontal line HL3 is connected to the fourth gate line GL4 which is farther from the pixel electrode of the blue pixel BP between the fourth and fifth gate lines GL4 and GL5 above the blue pixel BP.

Except for the connecting position of the gate lines, configurations of the display device illustrated in FIG. 1 and configurations of the display device illustrated in FIG. 8 are the same as each other, and thus descriptions pertaining to configurations illustrated in FIG. 8 will make reference to FIG. 1 and the related descriptions thereof.

FIG. 9 is a detailed view illustrating an exemplary embodiment of an area B of FIG. 8.

As illustrated in FIG. 9, a first gate electrode GE1 of a first switching element TFT1 and the fifth gate line GL5 may be unitary. The first gate electrode GE1 of the first switching element TFT1 may have a shape protruding from the fifth gate line GL5 toward the fourth gate line GL4.

That is, referring to FIG. 9, the first gate electrode GE1 of the first switching element TFT1 may be unitary with the fifth gate line GL5 which is farther from a first pixel electrode PE1 between the two gate lines GL4 and GL5. In contrast, referring to FIG. 2, the first gate electrode GE1 of the first switching element TFT1 is unitary with the fourth gate line GL4 which is closer to the first pixel electrode PE1 between the two gate lines GL4 and GL5.

As illustrated in FIG. 9, a second gate electrode GE2 of a second switching element TFT2 and the fourth gate line GL4 may be unitary. The second gate electrode GE2 of the second switching element TFT2 may have a shape protruding from the fourth gate line GL4 toward the fifth gate line GL5.

That is, referring to FIG. 9, the second gate electrode GE2 of the second switching element TFT2 may be unitary with the fourth gate line GL4 which is disposed farther from a second pixel electrode PE2 between the two gate lines GL4 and GL5. In contrast, referring to FIG. 2, the second gate electrode GE2 of the second switching element TFT2 is unitary with the fifth gate line GL5 which is closer to the second pixel electrode PE2 between the two gate lines GL4 and GL5.

According to the structure illustrated in FIG. 9, a first connecting portion 651 and a second connecting portion 652 are respectively disposed between the fourth data line DL4 and the gate electrode GE1 and between the fourth data line DL4 and the gate electrode GE2, and the gate electrodes GE1 and GE2 are respectively disposed adjacent to opposite sides of the fourth data line DL4, and thus the first gate electrode GE1 and the second gate electrode GE2 may be disposed relatively far from the fourth data line DL4. Accordingly, an aperture ratio of a pixel may increase as described hereinabove.

According to the structure illustrated in FIG. 9, a first connecting electrode 771 overlaps the fourth common line CL4 and the fourth gate line GL4, and a second connecting electrode 772 overlaps the fifth gate line GL5.

Except for the connecting position of the gate lines, configurations of the display device illustrated in FIG. 2 and configurations of the display device illustrated in FIG. 9 are the same as each other, and thus descriptions pertaining to configurations illustrated in FIG. 9 will make reference to FIGS. 2, 3, and 4 and the related descriptions thereof.

Structures of exemplary embodiments of a display device may be applicable to various display devices such as an LCD device and an organic light emitting diode ("OLED") display device.

As set forth above, according to one or more exemplary embodiment, a display device may provide the following effects.

According to one or more exemplary embodiment, a connecting portion between a drain electrode of a switching element and a pixel electrode is disposed closer to a data line than a gate electrode is to the data line. Accordingly, a distance between gate electrodes disposed adjacent to opposite sides of the data line may increase. Due to such a structure, a distance between the gate lines which defines a length of a switching element area may decrease, and a distance between the gate lines which defines a length of a pixel electrode area may increase by the decreased distance. As the length of the pixel electrode area increases, an aperture ratio of a pixel may increase.

From the foregoing, it will be appreciated that various exemplary embodiments in accordance with the present disclosure have been described herein for purposes of illustration, and that various modifications may be made without departing from the scope and spirit of the present teachings. Accordingly, the various exemplary embodiments disclosed herein are not intended to be limiting of the true scope and spirit of the present teachings. Various features of the above described and other exemplary embodiments can be mixed and matched in any manner, to produce further exemplary embodiments consistent with the invention.

What is claimed is:

1. A display device comprising:
   a first gate line and a data line which intersect each other;
   a pixel electrode;
   a switching element comprising a gate electrode connected to the first gate line, a source electrode connected to the data line, a drain electrode connected to the pixel electrode; and
   a connecting portion which connects the drain electrode with the pixel electrode,
   wherein a distance between the data line and the connecting portion is less than a distance between the data line and the gate electrode in a first direction perpendicular to the data line in a plan view.

2. The display device as claimed in claim 1, wherein the connecting portion is disposed between the data line and the gate electrode.

3. The display device as claimed in claim 2, wherein the connecting portion is disposed in an area surrounded by the data line, the gate electrode, the first gate line, and the source electrode.

4. The display device as claimed in claim 1, wherein the drain electrode and the pixel electrode are connected to each other through a contact hole positioned to an area corresponding to the connecting portion.

5. The display device as claimed in claim 1, further comprising a compensation pattern which extends from the first gate line and overlaps the drain electrode.

6. The display device as claimed in claim 1, wherein the source electrode comprises:
   an electrode portion which overlaps the gate electrode; and
   an extension portion which connects the electrode portion and the data line.

7. The display device as claimed in claim 6, wherein the extension portion overlaps the first gate line.

8. The display device as claimed in claim 1, further comprising a second gate line which intersects the data line and is adjacent to the first gate line, wherein the gate electrode is disposed between the first gate line and the second gate line.

9. The display device as claimed in claim 8, wherein a distance between the first gate line and the second gate line is in a range of about 30 micrometers to about 41 micrometers.

10. The display device as claimed in claim 8, further comprising a light blocking layer which overlaps the first gate line and the second gate line and is disposed between the first gate line and the second gate line.

11. The display device as claimed in claim 10, wherein the light blocking layer has a width from about 35 micrometers to about 38 micrometers or from about 40 micrometers to about 47 micrometers.

12. The display device as claimed in claim 8, wherein the gate electrode protrudes from the first gate line toward the second gate line.

13. The display device as claimed in claim 8, further comprising a common line which intersects the first gate line and the second gate line.

14. The display device as claimed in claim 13, wherein the switching element is disposed in an area surrounded by the first gate line, the second gate line, the data line, and the common line.

15. The display device as claimed in claim 13, wherein the pixel electrode overlaps the gate electrode, the drain electrode, the common line, and the first gate line.

16. The display device as claimed in claim 1, wherein the pixel electrode overlaps the first gate line.

17. The display device as claimed in claim 13, wherein the pixel electrode overlaps the gate electrode, the source electrode, the common line, and the second gate line.

18. The display device as claimed in claim 8, wherein the pixel electrode overlaps the source electrode and the second gate line.

19. A display device comprising:
a first gate line and a data line intersecting each other; and
a first switching element which comprises:
a first gate electrode connected to the first gate line;
a first source electrode connected to the data line; and
a first drain electrode including a portion disposed between a side, facing the data line, of the first gate electrode and the data line,
wherein a distance between the data line and the portion of the drain electrode is less than a distance between the data line and the first gate electrode.

20. The display device as claimed in claim 19, wherein the first switching element further comprises a compensation pattern which extends from the first gate line and overlaps the portion of the first drain electrode.

21. The display device as claimed in claim 19, further comprising:
a second gate line which intersects the data line,
wherein the first switching element is disposed between the first and second gate lines, and wherein a distance between the first gate line and the second gate line is in a range of about 30 micrometers to about 41 micrometers.

22. The display device as claimed in claim 21, wherein the first source electrode comprises:
an electrode portion which overlaps the first gate electrode; and
an extension portion which connects the electrode portion and the data line and overlaps one of the first and second gate lines.

23. The display device as claimed in claim 21, further comprising:
a second switching element which is disposed opposing the first switching element with respect to the data line and comprises:
a second gate electrode connected to the second gate line;
a second source electrode connected to the data line; and
a second drain electrode including a portion disposed between a side, facing the data line, of the second gate electrode and the data line.

\* \* \* \* \*